United States Patent
Kakinuma et al.

(10) Patent No.: US 10,529,914 B2
(45) Date of Patent: Jan. 7, 2020

(54) MAGNETIC MEMORY

(71) Applicant: TDK CORPORATION, Tokyo (JP)

(72) Inventors: Yuji Kakinuma, Tokyo (JP); Atsushi Tsumita, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/058,237

(22) Filed: Aug. 8, 2018

(65) Prior Publication Data
US 2019/0051815 A1 Feb. 14, 2019

(30) Foreign Application Priority Data
Aug. 10, 2017 (JP) .................. 2017-155861

(51) Int. Cl.
*G11C 11/00* (2006.01)
*H01L 43/02* (2006.01)
(Continued)

(52) U.S. Cl.
CPC ............ *H01L 43/02* (2013.01); *G11C 11/161* (2013.01); *G11C 11/1657* (2013.01); *G11C 11/1675* (2013.01); *G11C 11/1697* (2013.01); *G11C 11/18* (2013.01); *H01F 10/329* (2013.01); *H01L 27/228* (2013.01); *H01L 43/06* (2013.01); *H01L 43/08* (2013.01)

(58) Field of Classification Search
CPC ....... H01L 43/02; H01L 27/228; H01L 43/06; H01L 43/08; H01F 10/329; G11C 11/161; G11C 11/1657; G11C 11/1675; G11C 11/1697; G11C 11/18
See application file for complete search history.

(56) References Cited

U.S. PATENT DOCUMENTS

| 8,350,347 | B2 | 1/2013 | Gaudin et al. |
| 9,251,883 | B2 | 2/2016 | Wu et al. |
| 9,384,812 | B2 * | 7/2016 | Wu ...................... G11C 11/1693 |
| 9,858,975 | B1 * | 1/2018 | Hatcher .............. G11C 11/1655 |
| 2008/0278994 | A1 * | 11/2008 | Katti ................... G11C 11/5607 365/158 |

(Continued)

FOREIGN PATENT DOCUMENTS

WO 2016/021468 A1 2/2016

OTHER PUBLICATIONS

Ioan Mihai Miron et al. "Perpendicular Switching of a Single Ferromagnetic Layer Induced by In-Plane Current Injection". Nature, Aug. 11, 2011, vol. 476, pp. 189-194.

(Continued)

*Primary Examiner* — Toan K Le
(74) *Attorney, Agent, or Firm* — Oliff PLC

(57) ABSTRACT

Provided is a magnetic memory including: a first bit line, a second bit line, and a third bit line; a word line; a first magnetoresistance effect element; a first transistor; a second magnetoresistance effect element; and a second transistor, wherein free layers of the first and second magnetoresistance effect elements and the second bit line are connected, a fixed layer of the first magnetoresistance effect element and a source terminal of the first transistor are connected, a drain terminal of the first transistor and the first bit line are connected, a fixed layer of the second magnetoresistance effect element and a drain terminal of the second transistor are connected, a source terminal of the second transistor and the third bit line are connected, and the word line is connected to each of a gate terminal of the first transistor and a gate terminal of the second transistor.

14 Claims, 18 Drawing Sheets

(51) Int. Cl.
  H01L 27/22    (2006.01)
  G11C 11/16    (2006.01)
  H01F 10/32    (2006.01)
  G11C 11/18    (2006.01)
  H01L 43/06    (2006.01)
  H01L 43/08    (2006.01)

(56) References Cited

U.S. PATENT DOCUMENTS

| | | | |
|---|---|---|---|
| 2011/0103143 A1* | 5/2011 | Ranjan | G11C 11/5607 365/171 |
| 2012/0243308 A1* | 9/2012 | Saida | G11C 11/161 365/173 |
| 2012/0320666 A1* | 12/2012 | Ohno | H01L 43/08 365/158 |
| 2013/0070522 A1* | 3/2013 | Saida | G11C 11/16 365/173 |
| 2015/0348606 A1 | 12/2015 | Buhrman et al. | |
| 2017/0222135 A1 | 8/2017 | Fukami et al. | |

OTHER PUBLICATIONS

S. Fukami et al. "A Spin-Orbit Torque Switching Scheme with Collinear Magnetic Easy Axis and Current Configuration". Nature Nanotechnology, Mar. 21, 2016, pp. 1-6.

Y.K. Kato et al. "Observation of the Spin Hall Effect in Semiconductors". Science, Dec. 10, 2004, vol. 306, pp. 1910-1913.

Luqiao Liu et al. "Spin Torque Switching with the Giant Spin Hall Effect of Tantalum". Science, Mar. 13, 2012, vol. 336 and vol. 555, pp. 1-19 and pp. 1-12.

Luqiao Liu et al. "Current-Induced Switching of Perpendicularly Magnetized Magnetic Layers Using Spin Torque from the Spin Hall Effect". Physical Review Letters, Aug. 31, 2012, vol. 109, pp. 096602-1 through 096602-5.

Ki-Seung Lee et al. "Threshold Current for Switching of a Perpendicular Magnetic Layer Induced by Spin Hall Effect". Applied Physics Letters, 2013, vol. 102, pp. 112410-1 through 112410-5.

Ki-Seung Lee et al. "Themally Activated Switching of Perpendicular Magnet by Spin-Orbit Spin Torque". Applied Physics Letters, 2014, vol. 104, pp. 072413-1 through 072413-5.

Shunsuke Fukami et al. "Magnetization Switching by Spin-Orbit Torque in an Antiferromagnet-Ferromagnet Bilayer System". Nature Materials, Feb. 15, 2016, vol. 15, pp. 535-542.

S. Takahashi et al. "Spin Injection and Detection in Magnetic Nanostructures". Physical Review B, 2003, vol. 67, pp. 052409-1 through 052409-4.

Yeongkyo Seo et al. "Area-Efficient SOT-MRAM With a Schottky Diode". IEEE Electron Device Letters, Aug. 2016, vol. 37, No. 8, pp. 982-985.

Wei Zhang et al. "Spin Hall Effects in Metallic Antiferromagnets". Physical Review Letters, Nov. 7, 2014, vol. 113, pp. 196602-1 through 196602-6.

* cited by examiner

MAGNETIC MEMORY

BACKGROUND

The present disclosure relates to a magnetic memory.

Priority is claimed on Japanese Patent Application No. 2017-155861 filed Aug. 10, 2017, the content of which is incorporated herein by reference.

DESCRIPTION OF RELATED ART

As magnetoresistance effect elements, a giant magnetoresistance (GMR) element formed by a multi-layered film with a ferromagnetic layer and a nonmagnetic layer and a tunnel magnetoresistance (TMR) element using an insulating layer (a tunnel barrier layer or a barrier layer) as a nonmagnetic layer are known. Generally, a TMR element has higher element resistance than a GMR element and has a magnetoresistance (MR) ratio higher than that of a GMR element. A TMR element has attracted attention as an element for a magnetic sensor, a high-frequency component, a magnetic head, and a nonvolatile RAM (magnetoresistive random access memory (MRAM)).

As writing systems of an MRAM, a system performing writing (magnetization reversal) using a magnetic field generated by a current and a system performing writing (magnetization reversal) using a spin transfer torque (STT) generated by flow a current in a stacking direction of a magnetoresistance effect element are known.

In the system using a magnetic field, there are cases in which, when the size of the element is decreased, there is a limit on a current that can flow through a thin wiring, and appropriate writing may not be able to be performed.

In contrast to this, in the system using a spin transfer torque (STT), ferromagnetic layers (a fixed layer and a reference layer) of one side perform spin polarization of a current, spin-polarized spin is transferred to ferromagnetic layers of the other side (a free layer and a recording layer) using a current, and writing (magnetization reversal) is performed using a torque (STT) generated at that time. For this reason, the system using a spin transfer torque (STT) has an advantage that a current required for writing decreases as the element size decreases.

While the magnetization reversal of a TMR element using an STT is efficient from the viewpoint of energy efficiency, there is a problem in that the inversion current density for the magnetization reversal is high. From the viewpoint of a long life of a TMR element, it is preferable that this inversion current density be low. This point is similar for a GMR element.

Accordingly, in either magnetoresistance effect element from a TMR element and a GMR element, it is preferable to decrease a current density flowing through the magnetoresistance effect element.

There is a time difference in a TMR element using an STT until magnetization reversal occurs after application of an inversion current, and time is required for writing.

The magnetization reversal using an STT occurs in accordance with precession of magnetization induced inside a free layer. The precession of magnetization gradually increases in accordance with the application of an inversion current. For this reason, the magnetization reversal using an STT has a time difference until magnetization reversal occurs from the application of an inversion current in principle.

In recent years, it has been proposed that magnetization reversal using a pure spin current generated in accordance with a spin-orbit interaction could be applied (for example, I. M. Miron, K. Garello, G. Gaudin, P. -J. Zermatten, M. V. Costache, S. Auffret, S. Bandiera, B. Rodmacq, A. Schuhl, and P. Gambardella, Nature, 476, 189 (2011)). A pure spin current that has undergone spin-orbit-interaction induces a spin-orbit torque (SOT) and induces magnetization reversal in accordance with the SOT. The pure spin current is generated by the same number of electrons having upward and downward spins flowing in opposite directions, the flows of the electric charge being cancelled out each other, and the amount of current being generated in accordance with the pure spin current being zero. When magnetization can be reversed only using a pure spin current, a current flowing through the MR element is zero, and the magnetoresistance effect element can be expected to have a long life.

In S. Fukami, T. Anekawa, C. Zhang, and H. Ohno, Nature Nanotechnology, DOI:10.1038/NNANO. 2016. 29, in magnetization reversal using an SOT, a phenomenology in which magnetization reversal occurs is described (see FIG. 1 of S. Fukami, T. Anekawa, C. Zhang, and H. Ohno, Nature Nanotechnology, DOI:10.1038/NNANO. 2016. 29). The magnetization reversal using an SOT does not necessarily occur while precession is performed. In other words, the mechanism of the magnetization reversal using an SOT is different from that of the magnetization reversal using an STT.

SUMMARY

In an MRAM circuit, in which the current for acquiring an SOT effect flows near the free layer of the magnetoresistance effect element, and the current for acquiring an STT effect flows in the direction vertically passing through the free layer and a fixed layer, it is preferable that the memory is as fast as possible. Moreover, it is preferable that the memory employs an 1M1T configuration (a configuration in which one transistor is included in one memory) for a higher density.

However, in a case in which a three-terminal device semiconductor circuit having an 1M1T configuration is employed, when write/read is performed, it is necessary to decrease an allowed margin value due to the influence of heavy metal resistance or the like, and there is a large leakage current.

The present disclosure has been realized in view of the problems described above, and an object thereof is to provide a magnetic memory in which an allowed value of the margin is able to be increased and a leakage current is able to be decreased.

According to one aspect of the present disclosure, there is provided a magnetic memory including: a first bit line, a second bit line, and a third bit line; a word line; a first magnetoresistance effect element; a first transistor; a second magnetoresistance effect element; and a second transistor, wherein a series circuit of the first magnetoresistance effect element and the first transistor is present between the first bit line and the second bit line, a free layer of the first magnetoresistance effect element and the second bit line are connected to each other, a fixed layer of the first magnetoresistance effect element and a source terminal of the first transistor are connected to each other, a drain terminal of the first transistor and the first bit line are connected to each other, a series circuit of the second magnetoresistance effect element and the second transistor is present between the second bit line and the third bit line, a free layer of the second magnetoresistance effect element and the second bit line are connected to each other, a fixed layer of the second magnetoresistance effect element and a drain terminal of the second transistor are connected to each other, a source terminal of the second transistor and the third bit line are connected to each other, and the word line is connected to each of a gate terminal of the first transistor and a gate terminal of the second transistor.

In the above-described aspect of the present disclosure, the magnetic memory may configured for a spin orbit torque to be induced by applying a voltage difference between both ends of the second bit line.

In the above-described aspect of the present disclosure, each of the free layer of the first magnetoresistance effect element and the free layer of the second magnetoresistance effect element may be conductively connected to a first face and a second face of the second bit line facing each other, respectively.

In the above-described aspect of the present disclosure, at least a part of a face, on which the free layer of the first magnetoresistance effect element contacts the first face of the second bit line, and a face, on which the free layer of the second magnetoresistance effect element contacts the second face of the second bit line, may overlap at a first connection point at which the free layer of the first magnetoresistance effect element is conductively connected to the first face of the second bit line and a second connection point at which the free layer of the second magnetoresistance effect element is conductively connected to the second face of the second bit line, as viewed in a direction perpendicular to the first face and the second face.

The above-described aspect of the present disclosure may further includes: a first switching circuit, a second switching circuit, a third switching circuit, and a fourth switching circuit; a first voltage generating circuit, a second voltage generating circuit, a third voltage generating circuit, and a fourth voltage generating circuit; and a row decoder, wherein one end of the first switching circuit is connected to one end of the first bit line, and the other end of the first switching circuit is connected to the first voltage generating circuit, one end of the second switching circuit is connected to one end of the second bit line, and the other end of the second switching circuit is connected to the second voltage generating circuit, one end of the third switching circuit is connected to the other end of the second bit line, and the other end of the third switching circuit is connected to the third voltage generating circuit, one end of the fourth switching circuit is connected to one end of the third bit line, and the other end of the fourth switching circuit is connected to the fourth voltage generating circuit, and the row decoder is connected to one end of the word line.

In the above-described aspect of the present disclosure, the magnetic memory may be configured in such way that an identical data are written on the first magnetoresistance effect element and the second magnetoresistance effect element by: an SOT current flowing to the second bit line due to application of an electric potential difference between the second voltage generating circuit and the third voltage generating circuit; and an STT current flowing to both of the first magnetoresistance effect element and the second magnetoresistance effect element due to application of an electric potential difference between the first voltage generating circuit and the fourth voltage generating circuit at a timing after start of flowing of the SOT current for a predetermined voltage to be applied to the word line.

In the above-described aspect of the present disclosure, the magnetic memory may be configured in such way that data are written on one of the first magnetoresistance effect element and the second magnetoresistance effect element by: an SOT current flowing to the second bit line due to application of an electric potential difference between the second voltage generating circuit and the third voltage generating circuit; and an STT current flowing to the one of the first magnetoresistance effect element and the second magnetoresistance effect element due to application of an electric potential difference between the first voltage generating circuit and the fourth voltage generating circuit at a timing after start of flowing of the SOT current for a predetermined voltage to be applied to the word line.

According to the present disclosure, in a magnetic memory, an allowed value of a margin can be increased, and a leakage current can be decreased.

DETAILED DESCRIPTION OF THE INVENTION

Figure 1:
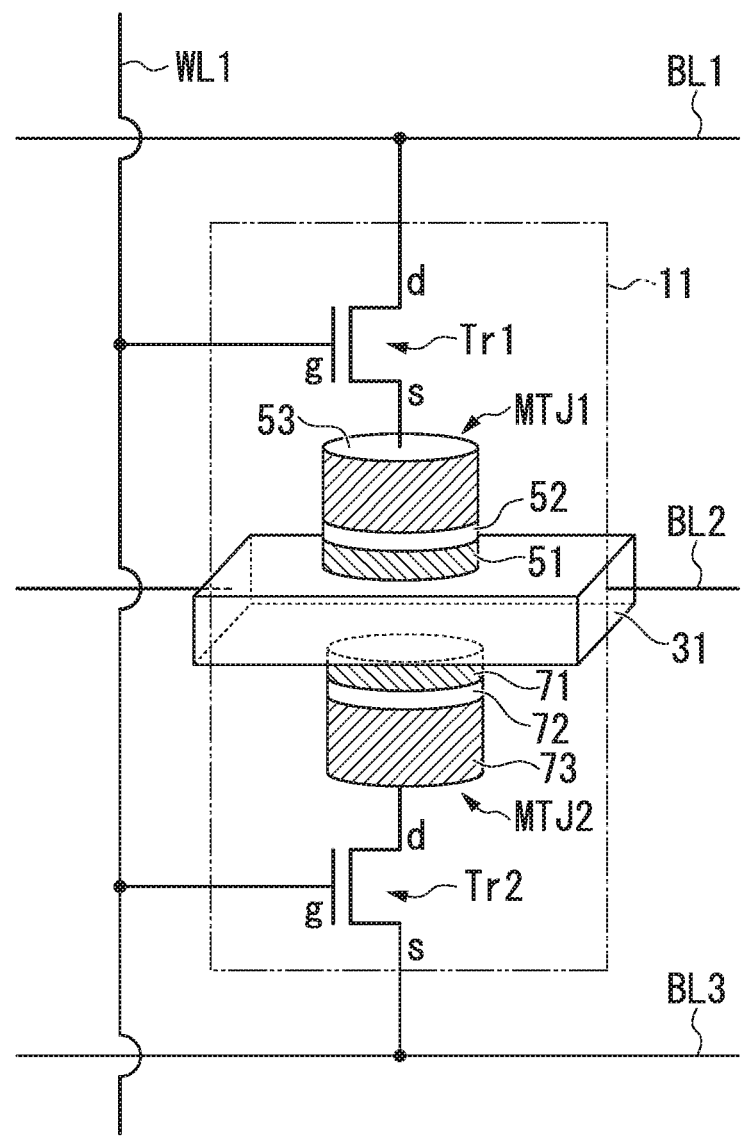
FIG. 1 is a diagram illustrating the configuration of a magnetic memory (unit magnetic memory) of a unit cell according to an embodiment of the present disclosure.

Hereinafter, this embodiment will be described in detail with reference to the drawings as is appropriate. In the drawings used in the following description, in order to allow easy understanding of aspects of this embodiment, characteristic portions may be represented in enlarged scales for the convenience of the description, and the dimensions, the proportions, and the like of each constituent element may be different from actual values thereof. Materials, dimensions, and the like represented in the following description are examples, and thus, this embodiment is not limited thereto, and may be appropriately changed in a range in which the effects of this embodiment are accomplished.

[Magnetic Memory of Unit Cell]

In this embodiment, for the convenience of description, a magnetic memory set as a unit cell of a constituent element according to this embodiment will be referred to as a "unit magnetic memory." In this embodiment, one magnetic memory is configured by using a plurality of unit magnetic memories. The magnetic memory is a nonvolatile memory.

FIG. 1 is a diagram illustrating the configuration of a magnetic memory (unit magnetic memory 11) of a unit cell according to an embodiment of the present disclosure.

Figure 2:
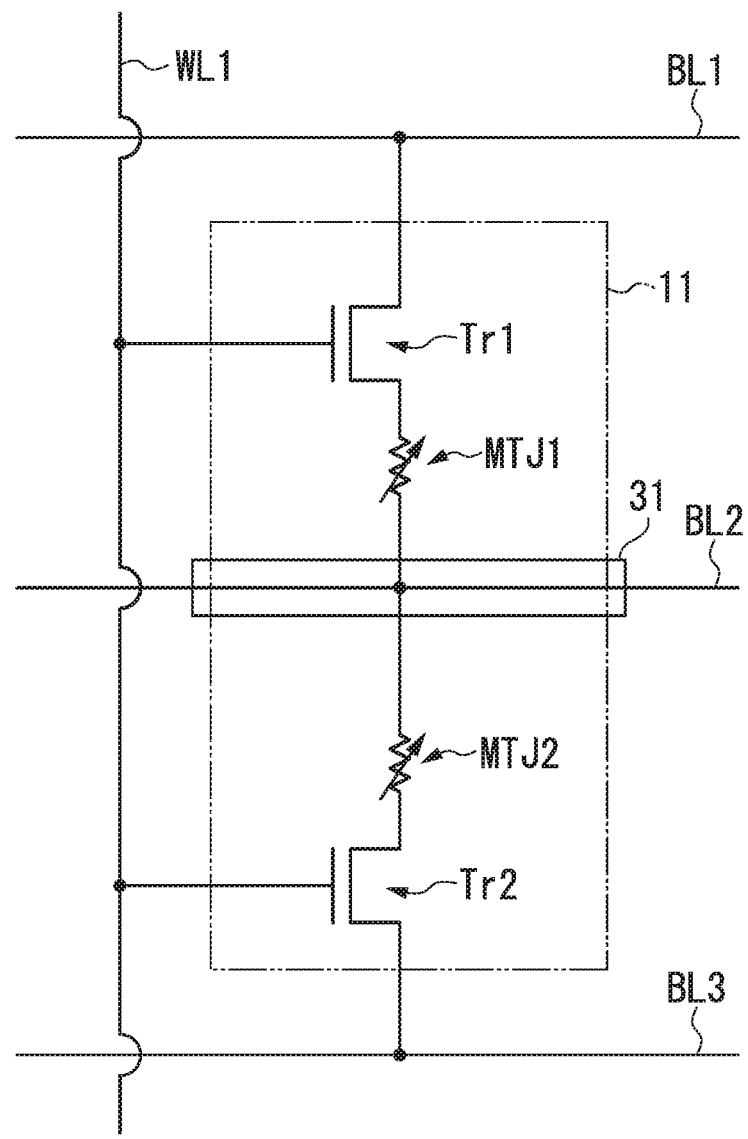
FIG. 2 is a diagram illustrating an equivalent circuit of a magnetic memory (unit magnetic memory) of a unit cell according to an embodiment of the present disclosure.

FIG. 2 is a diagram illustrating an equivalent circuit of the magnetic memory (unit magnetic memory 11) of a unit cell according to an embodiment of the present disclosure.

The unit magnetic memory 11 includes a spin-orbit torque wiring 31, a first magnetoresistance effect element MTJ1, a first transistor Tr1, a second magnetoresistance effect element MTJ2, and a second transistor Tr2.

In addition, a first bit line BL1, a second bit line BL2, a third bit line BL3, and a first word line WL1 are connected to the unit magnetic memory 11.

It may be regarded that bit lines (the first bit line BL1, the second bit line BL2, and the third bit line BL3) and a word line (the first word line WL1) are included in the unit magnetic memory 11.

Here, the first magnetoresistance effect element MTJ1 and the first transistor Tr1 are connected in series and configure a series circuit.

In addition, the second magnetoresistance effect element MTJ2 and second transistor Tr2 are connected in series and configure a series circuit.

Here, each of the first transistor Tr1 and the second transistor Tr2 is a transistor (selection transistor) used for selection.

In this embodiment, as each of two magnetoresistance effect elements (the first magnetoresistance effect element MTJ1 and the second magnetoresistance effect element MTJ2), a magnetic tunnel junction (MTJ) element is used.

As another configuration example, as each of two magnetoresistance effect elements (the first magnetoresistance effect element MTJ1 and the second magnetoresistance effect element MTJ2), a giant magneto-resistor may be used.

The spin-orbit torque wiring 31 is a cube and has a plate shape.

The two magnetoresistance effect elements (the first magnetoresistance effect element MTJ1 and the second magnetoresistance effect element MTJ2) are connected to two faces, which are included in the spin-orbit torque wiring 31, facing each other. As the two faces, which are included in the spin-orbit torque wiring 31, facing each other, for example, faces having large sizes among faces included in the cube are used. The faces, for example, may be referred to as an "upper face" and a "lower face" facing each other, one "side face" and "the other side face," facing each other or any other names.

The first magnetoresistance effect element MTJ1 has a configuration in which a free layer 51, a nonmagnetic layer 52, and a fixed layer 53 are stacked. The first magnetoresistance effect element MTJ1 is in contact with (bonded to) the face of the spin-orbit torque wiring 31 on a face of the free layer 51. Such layers (the free layer 51, the nonmagnetic layer 52, and the fixed layer 53) have circular shapes (or approximately circular shapes) when seen from the stacking direction.

The second magnetoresistance effect element MTJ2 has a configuration in which a free layer 71, a nonmagnetic layer 72, and a fixed layer 73 are stacked. The second magnetoresistance effect element MTJ2 is in contact with (bonded to) the face of the spin-orbit torque wiring 31 on a face of the free layer 71. Such layers (the free layer 71, the nonmagnetic layer 72, and the fixed layer 73) have circular shapes (or approximately circular shapes) when seen from the stacking direction.

Each of the first transistor Tr1 and second transistor Tr2 is a field effect transistor (FET) and includes a gate (g) terminal, a source (s) terminal, and a drain (d) terminal.

In the first transistor Tr1, the gate (g) terminal is connected to the first word line WL1, the source (s) terminal is connected to a face of the fixed layer 53 of the first magnetoresistance effect element MTJ1, and the drain (d) terminal is connected to the first bit line BL1.

In the second transistor Tr2, a gate (g) terminal is connected to the first word line WL1, a source (s) terminal is connected to the third bit line BL3, and a drain (d) terminal is connected to a face of the fixed layer 73 of the second magnetoresistance effect element MTJ2.

The spin-orbit torque wiring 31 is connected as the second bit line BL2.

More detailed description will be presented.

In this embodiment, a configuration will be described in which the spin-orbit torque wiring 31 extends in a direction intersecting the stacking direction of the two magnetoresistance effect elements (the first magnetoresistance effect element MTJ1 and second magnetoresistance effect element MTJ2), and, as one example thereof, the spin-orbit torque wiring 31 and the two magnetoresistance effect elements (the first magnetoresistance effect element MTJ1 and second magnetoresistance effect element MTJ2) are orthogonal to each other.

The first transistor Tr1 is a wiring used for flowing a current in the stacking direction of the first magnetoresistance effect element MTJ1.

The second transistor Tr2 is a wiring used for flowing a current in the stacking direction of the second magnetoresistance effect element MTJ2.

In the configuration illustrated in FIG. 1, for example, a substrate (not illustrated in the drawing) forming such wirings may be included.

The first magnetoresistance effect element MTJ1 includes the free layer 51 that is a ferromagnetic metal layer of which the magnetization direction changes, the fixed layer 53 that is a ferromagnetic metal layer of which the magnetization direction is fixed, and the nonmagnetic layer 52 that is interposed between the free layer 51 and the fixed layer 53.

The second magnetoresistance effect element MTJ2 includes the free layer 71 that is a ferromagnetic metal layer of which the magnetization direction changes, the fixed layer 73 that is a ferromagnetic metal layer of which the magnetization direction is fixed, and the nonmagnetic layer 72 that is interposed between the free layer 71 and the fixed layer 73.

In the first magnetoresistance effect element MTJ1, the direction of magnetization of the free layer 51 relatively changes with respect to the magnetization of the fixed layer 53 that is a ferromagnetic metal layer of which the magnetization is fixed in one direction. Accordingly, the first magnetoresistance effect element MTJ1 functions as a magnetoresistance effect element. In a case in which the first magnetoresistance effect element MTJ1 is applied to a coercivity-differed type (pseudo spin valve-type) MRAM, the coercivity of the fixed layer 53 is configured to be higher than the coercivity of the free layer 51. On the other hand, in a case in which the first magnetoresistance effect element MTJ1 is applied to an exchange bias type (spin valve type) MRAM, the fixed layer 53 fixes the magnetization direction in accordance with exchange coupling with an antiferromagnetic layer of the fixed layer 53. This similarly applies also to the second magnetoresistance effect element MTJ2.

In this embodiment, the two magnetoresistance effect elements (the first magnetoresistance effect element MTJ1 and the second magnetoresistance effect element MTJ2) are magnetic tunnel junction elements of which the nonmagnetic layers 52 and 72 are formed of insulators.

In addition, as another configuration example, the two magnetoresistance effect elements (the first magnetoresistance effect element MTJ1 and the second magnetoresistance effect element MTJ2) may be giant magnetoresistance (GMR) elements of which the nonmagnetic layers 52 and 72 are formed of metals.

As the two magnetoresistance effect elements (the first magnetoresistance effect element MTJ1 and the second magnetoresistance effect element MTJ2) according to this embodiment, configurations of known magnetoresistance effect elements may be used. For example, each layer may be formed of a plurality of layers, and other layers such as antiferromagnetic layers used for fixing the magnetization directions of the fixed layers 53 and 73 may be included. The free layers 51 and 71, for example, may be referred to as recording layers or the like. The fixed layers 53 and 73 may be referred to as reference layers or the like.

Each of the free layers 51 and 71 and the fixed layers 53 and 73 may be an in-plane magnetization film of which the magnetization direction is parallel to the layer or a vertical magnetization film of which the magnetization direction is perpendicular to the layer.

As materials of the fixed layers 53 and 73, known materials may be used. For example, a metal selected from among a group formed from Cr, Mn, Co, Fe, and Ni and an alloy, which exhibits a ferromagnetic property, containing one or more of such metals may be used. In addition, an alloy containing such a metal and at least one or more elements from B, C, and N may be used as the material of the fixed layers 53 and 73. More specifically, examples thereof include Co—Fe and Co—Fe—B.

In order to acquire a higher output, it is preferable to use a Heusler alloy such as $Co_2FeSi$ for the fixed layers 53 and 73. A Heusler alloy contains an intermetallic compound having a chemical composition of $X_2YZ$. Here, X is a transition metal element from the Co, Fe, Ni, or Cu groups or a noble metal element from the periodic table, Y is a transition metal from the Mn, V, Cr, or Ti groups or an element from the groups for X, and Z is a typical element from Group III to Group V. Examples of the Heusler alloy include $Co_2FeSi$, $Co_2MnSi$, $Co_2Mn_{1-a}Fe_aAl_bSi_{1-b}$, and the like.

In order to increase the coercivity of the fixed layers 53 and 73 with respect to the free layers 51 and 71, an antiferromagnetic material such as IrMn or PtMn may be used as a material brought into contact with the fixed layers 53 and 73. In order to prevent the influence of leakage magnetic fields of the fixed layers 53 and 73 on the free layers 51 and 71, a structure of a synthetic ferromagnetic coupling may be used.

In a case in which the direction of the magnetization of the fixed layers 53 and 73 is perpendicular to the stacking face, it is preferable to use a stacking film of Co and Pt in the fixed layers 53 and 73. More specifically, as the fixed layers 53 and 73, [Co (0.24 nm)/Pt(0.16 nm)]6/Ru (0.9 nm)/[Pt (0.16 nm)/Co (0.16 nm)]$_4$/Ta (0.2 nm)/FeB (1.0 nm) may be used.

As the material of the free layers 51 and 71, a ferromagnetic material, more particularly, a soft magnetic material may be used. For example, a metal selected from among a group formed from Cr, Mn, Co, Fe, and Ni, an alloy containing one or more of such metals, an alloy containing such metals and at least one or more of B, C, and N, or the like may be used as the material of the free layers 51 and 71. More specifically, examples thereof include Co—Fe, Co—Fe—B, and Ni—Fe.

In a case in which the direction of the magnetization of the free layers 51 and 71 is perpendicular to the stacking face, it is preferable to configure the thickness of the free layers 51 and 71 to be 2.5 nm or the less. In interfaces between the free layers 51 and 71 and the nonmagnetic layers 52 and 72, vertical magnetic anisotropy may be added to the free layers 51 and 71. When the film thickness of the free layers 51 and 71 is increased, the effect of the vertical magnetic anisotropy inducing magnetization to face toward the direction perpendicular to the stacking face is attenuated, and accordingly, it is preferable that the film thickness of the free layers 51 and 71 be small.

For the nonmagnetic layers 52 and 72, a known material may be used.

For example, in a case in which the nonmagnetic layers 52 and 72 are formed from an insulator (in the case of a tunnel barrier layer), as the material thereof, $Al_2O_3$, $SiO_2$, MgO, $MgAl_2O_4$, or the like may be used. In addition, other than such materials, a material acquired by substituting a part of Al, Si, or Mg with Zn, Be, or the like may be used for the nonmagnetic layers 52 and 72. Among such materials, MgO and $MgAl_2O_4$ are materials that can realize a coherent tunnel, and with which spin can be efficiently injected to an adjacent magnetic metal layer.

In a case in which the nonmagnetic layers 52 and 72 are formed from a metal, Cu, Au, Ag, or the like may be used as the material thereof.

On faces of the free layers 51 and 71 that are opposite to the nonmagnetic layers 52 and 72, cap layers (not illustrated in the drawing) may be formed. The cap layers can suppress diffusion of elements from the nonmagnetic layers 52 and 72. In addition, the cap layers contribute also to the crystal orientation of each layer of the magnetoresistance effect element (the first magnetoresistance effect element MTJ1 and the second magnetoresistance effect element MTJ2). By disposing the cap layers, the magnetization of the fixed layers 53 and 73 and the free layers 51 and 71 of the magnetoresistance effect elements (the first magnetoresistance effect element MTJ1 and the second magnetoresistance effect element MTJ2) is stabilized, and the resistance of the magnetoresistance effect elements (the first magnetoresistance effect element MTJ1 and the second magnetoresistance effect element MTJ2) can be lowered.

It is preferable to use a material having high conductivity for the cap layers. For example, Ru, Ta, Cu, Ag, or Au may be used. It is preferable to appropriately set the crystal structure of the cap layer to an fcc structure, an hcp structure, and a bcc structure in accordance with the crystal structure of an adjacent ferromagnetic metal layer.

For the cap layer, it is preferable to use any one selected from among a group formed from silver, copper, magnesium, and aluminum. While details will be described later, in a case in which the spin-orbit torque wiring 31 and the magnetoresistance effect elements (the first magnetoresistance effect element MTJ1 and the second magnetoresistance effect element MTJ2) are connected through the cap layers, it is preferable for the cap layers not to disperse spin propagating from the spin-orbit torque wiring 31. Silver, copper, magnesium, aluminum, and the like have long spin diffusion lengths of 100 nm or more, and thus, it is difficult for the spin to be dispersed with these.

The thickness of the cap layer is preferably a spin diffusion length of the material composing the cap layer or less. In a case in which the thickness of the cap layer is the spin diffusion length or less, spin propagating from the spin-orbit torque wiring 31 can be sufficiently delivered to the magnetoresistance effect elements (the first magnetoresistance effect element MTJ1 and the second magnetoresistance effect element MTJ2).

The spin-orbit torque wiring 31 extends in a direction intersecting the stacking direction of the magnetoresistance effect elements (the first magnetoresistance effect element MTJ1 and the second magnetoresistance effect element MTJ2). The spin-orbit torque wiring 31 is electrically connected to a power supply (not illustrated in the drawing) flowing a current in a direction intersecting the stacking direction of the magnetoresistance effect elements (the first magnetoresistance effect element MTJ1 and the second magnetoresistance effect element MTJ2) and has a spin injecting function of injecting a pure spin current to the magnetoresistance effect elements (the first magnetoresistance effect element MTJ1 and the second magnetoresistance effect element MTJ2) together with the power supply.

The spin-orbit torque wiring 31 may be either directly connected to the free layers 51 and 71 or connected thereto through other layers. For example, the spin-orbit torque wiring 31 and the free layers 51 and 71 may be connected through the cap layers.

The spin-orbit torque wiring 31 is connected to the free layers 51 and 71 in conductive states.

The spin-orbit torque wiring 31 is formed from a material generating a pure spin current in accordance with a spin Hall effect when a current flows through it. As such a material, a material having a composition generating a pure spin current in the spin-orbit torque wiring may be used. Thus, the spin-orbit torque wiring 31 is not limited to being composed from a single element but may be formed from a portion composed using a material generating a pure spin current and a portion composed using a material not generating a pure spin current or the like.

The spin Hall effect is a phenomenon in which a pure spin current is induced in a direction orthogonal to the direction of the orientation of the current on the basis of a spin orbit interaction in a case in which a current flows through the material.

Figure 3:
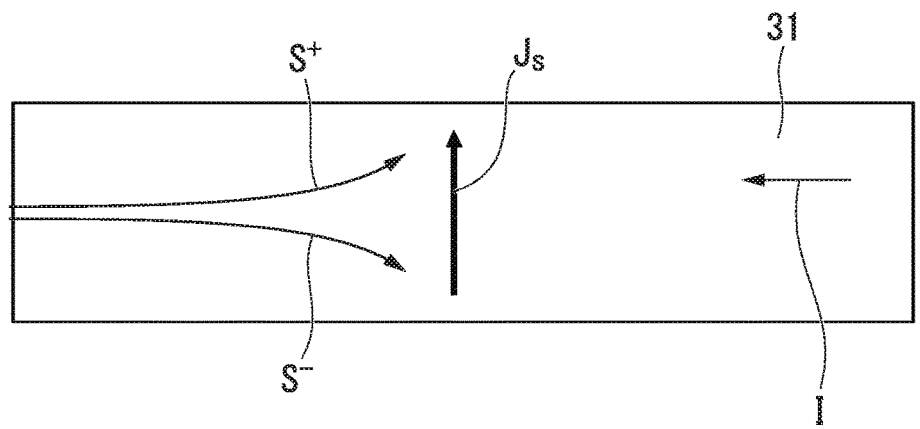
FIG. 3 is a schematic view illustrating a spin Hall effect according to an embodiment of the present disclosure.

FIG. 3 is a schematic view illustrating a spin Hall effect according to an embodiment of the present disclosure. A mechanism in which a pure spin current is generated in accordance with the spin Hall effect will be described on the basis of FIG. 3.

As illustrated in FIG. 3, when a current I flows in the extending direction of the spin-orbit torque wiring 31, each of upward spin $S^+$ and downward spin $S^-$ bends in a direction orthogonal to the current. A general Hall effect and the spin Hall effect are the same in that a movement direction of moving electric charge (electrons) bends. On the other hand, while charged particles moving inside a magnetic field bend in the moving direction by receiving a Lorentz force in the general Hall effect, the moving direction bends in accordance with only the movement of electrons (only the flow of a current) under no presence of a magnetic field in the spin Hall effect, which is different from the case of the general Hall effect.

In a non-magnetic substance (a material that is not a ferromagnetic substance), the number of electrons having upward spin $S^+$ and the number of electrons having downward spin $S^-$ are the same, and the number of electrons having upward spin $S^+$ facing toward the upper side in the drawing and the number of electrons having downward spin $S^-$ facing the lower side are the same. For this reason, a current as a net flow of electric charge is zero. A spin current not accompanying this current is particularly called as a pure spin current.

In contrast to this, also in a case in which a current flows in a ferromagnetic substance, upward-spin electrons and downward-spin electrons are bent in opposite directions. However, in the ferromagnetic substance, a state is formed in which one of an amount of upward-spin electrons and downward-spin electrons is extremely large, and, as a result, a net flow of electric charges occurs (a voltage is generated). Thus, in the material of the spin-orbit torque wiring 31, a material formed only from a ferromagnetic substance is not included.

Here, when the flow of electrons having upward spin $S^+$ is denoted by $J_\uparrow$, the flow of electrons having downward spin $S^-$ is denoted by $J_\downarrow$, and a spin current is denoted by $J_S$, the spin current is defined as $J_S=J_\uparrow-J_\downarrow$. In the case illustrated in FIG. 3, $J_S$ flows in the upward direction in the drawing as a pure spin current. Here, $J_S$ is the flow of electrons of which polarizability is 100%. In the case illustrated in FIG. 3, when a ferromagnetic substance is brought into contact with an upper face of the spin-orbit torque wiring 31, the pure spin current diffuses and flows into the ferromagnetic substance.

In this embodiment, a pure spin current is generated by flowing a current through the spin-orbit torque wiring 31 in this way, and the pure spin current diffuses to the free layers 51 and 71 that are in contact with the spin-orbit torque wiring 31. In accordance with the pure spin current that has diffused to the free layers 51 and 71, a spin orbit torque (SOT) effect occurs, and the magnetization reversal of the free layers 51 and 71 is assisted.

As methods of assisting the magnetization reversal, a method of applying an external magnetic field, a method of applying a voltage, a method of applying heat, and a method using distortion of a material are known. However, in the case of the method of applying an external magnetic field, the method of applying a voltage, or the method of applying heat, it is necessary to externally arrange new wirings, a heat generation source, and the like, and the element configuration becomes complex. In the case of the method using distortion of a material, it may be difficult to control distortion that has occurred in an application form, and magnetization reversal may not be able to be performed with good controllability.

The spin-orbit torque wiring 31 may contain a nonmagnetic heavy metal. Here, the heavy metal is used in the meaning of a metal having a specific gravity of yttrium or more. The spin-orbit torque wiring 31 may be formed only from a nonmagnetic heavy metal.

The nonmagnetic heavy metal is preferably a non-magnetic metal, which has d electrons or f electrons in the outermost shell, having a high atomic number of 39 or more. Such a nonmagnetic metal has a large spin orbit interaction inducing the spin Hall effect. The spin-orbit torque wiring 31 may be formed only from a nonmagnetic metal, which has a d electron or an f electron in the outermost shell, having an atomic number of 39 or more.

Normally, when a current flows in a metal, all the electrons move in a direction opposite to that of the current regardless of the orientation of the spin. In contrast to this, a nonmagnetic metal, which has a d electron or an f electron in the outermost shell, having a large atomic number has a large spin orbit interaction and has a direction, in which electrons move in accordance with the spin Hall effect, which depends on the orientation of the spin of the electrons. For this reason, a nonmagnetic metal, which has a d electron or an f electron in the outermost shell, having a large atomic number may easily generate a pure spin current $J_S$.

The spin-orbit torque wiring 31 may contain a magnetic metal. The magnetic metal represents a ferromagnetic metal or an antiferromagnetic metal. When a small amount of magnetic metal is included in the nonmagnetic metal, a spin orbit interaction is reinforced, and spin current generation efficiency with respect to a current flowing through the spin-orbit torque wiring 31 is increased. The spin-orbit torque wiring 31 may be formed only from an antiferromagnetic metal.

The spin orbit interaction is generated in accordance with a unique inner field of the material of the spin-orbit torque wiring material, and a pure spin current is generated also in a nonmagnetic material. When a small amount of magnetic metal is added to the spin-orbit torque wiring material, the magnetic metal scatters electron spin, and the spin current generation efficiency is improved. Here, when the amount of addition of a magnetic metal is increased too much, the generated pure spin current is scattered by the added magnetic field, and, as a result, the spin current is decreased. Accordingly, it is preferable that the mole ratio of the added magnetic metal is sufficiently smaller than the mole ratio of the main component of a pure spin generating part of the spin-orbit torque wiring. The mole ratio of the added magnetic metal is preferably 3% or less as a reference.

The spin-orbit torque wiring 31 may contain a topological insulator. The spin-orbit torque wiring 31 may be formed only from a topological insulator. The topological insulator is a material, of which the inside is an insulator or a resistor of high resistance, having a surface in which a spin-polarized metal state occurs. In this material, an inner magnetic field called a spin orbit interaction is generated. For this reason, a new topological phase is formed in accordance with the effect of the spin-orbit interaction even without an external magnetic field. This is the topological insulator, and a pure spin current can be generated with high efficiency in accordance with a strong spin orbit interaction and destruction of inversion symmetry in the edge.

As a topological insulator, for example, SnTe, $Bi_{1.5}Sb_{0.5}Te_{1.7}Se_{1.3}$, $TlBiSe_2$, $Bi_2Te_3$, $(Bi_{1-x}Sb_x)_2Te_3$, or the like are preferably used. Such a topological insulator can generate a spin current with high efficiency.

Next, a writing operation and a reading operation in the unit magnetic memory 11 will be described.

<Writing Operation>

There are two systems of writing operations.

A first system is a system in which writing (magnetization reversal) is performed using only a spin orbit torque (SOT) induced by a pure spin current. A second system is a system that assists writing that uses a spin transfer torque (STT) by using a spin orbit torque (SOT).

Here, in this embodiment, although the second system is used, the other system may be used as well.

First, the first system will be described.

A current (a current used for acquiring an SOT effect) is induced to flow through the spin-orbit torque wiring 31.

The current flowing inside the spin-orbit torque wiring 31 induces a spin current. The spin current induced inside the spin-orbit torque wiring 31 penetrates into the free layers 51 and 71 of the first magnetoresistance effect element MTJ1 and the second magnetoresistance effect element MTJ2 and gives spin orbit torques (SOT) to spins inside the free layers 51 and 71. As a result, the directions of magnetization of the free layers 51 and 71 of the magnetoresistance effect element MTJ1 in which data is to be written are reversed. In other words, a writing operation of the magnetoresistance effect elements MTJ1 and MTJ2 is performed.

Next, the second system will be described.

A current (a current used for acquiring an SOT effect) is induced to flow through the spin-orbit torque wiring 31.

In addition, a current (a current used for acquiring an STT effect) is induced to flow in the stacking direction of the first magnetoresistance effect element MTJ1 and the second magnetoresistance effect element MTJ2 (the stacking direction of the free layers 51 and 71, the nonmagnetic layers 52 and 72, and the fixed layers 53 and 73).

A current flowing inside the spin-orbit torque wiring 31 induces a spin current. The spin current induced inside the spin-orbit torque wiring 31 penetrates into the free layers 51 and 71 of the magnetoresistance effect elements MTJ1 and MTJ2 and gives spin orbit torques (SOT) to spins inside the free layers 51 and 71.

In addition, the current flowing in the stacking direction of the magnetoresistance effect elements MTJ1 and MTJ2 induces a spin transfer torque (STT). As a result, the directions of magnetization of the free layers 51 and 71 of the magnetoresistance effect elements MTJ1 and MTJ2 are reversed by receiving the spin orbit torque and the spin transfer torque. In other words, a writing operation of the magnetoresistance effect elements MTJ1 and MTJ2 is performed.

<Reading Operation>

A reading operation is performed by flowing a current in the stacking direction of the magnetoresistance effect elements MTJ1 and MTJ2. The current induced to flow is a small current of a degree for which the directions of magnetization of the free layers 51 and 71 of the magnetoresistance effect elements MTJ1 and MTJ2 are not reversed.

In the magnetoresistance effect elements MTJ1 and MTJ2, a resistance value is different between a case in which a writing operation is performed and a case in which a writing operation is not performed. The reason for this is that a resistance value in the stacking direction of the magnetoresistance effect elements MTJ1 and MTJ2 is different between a case in which the direction of magnetization of the free layers 51 and 71 and the direction of magnetization of the fixed layers 53 and 73 are opposite directions and a case in which the directions described above are the same direction.

Then, by reading a resistance value (a resistance value different in accordance with a value of stored data) of the magnetoresistance effect elements MTJ1 and MTJ2 as an electric potential difference in the stacking direction of the magnetoresistance effect elements MTJ1 and MTJ2, a reading operation is performed.

<Erasing Operation>

In addition, in this embodiment, although detailed description will not be presented, a circuit used for erasing data written in the magnetoresistance effect elements MTJ1 and MTJ2 may be included. As an example, a circuit that resets the directions of magnetization of the free layers 51 and 71 of the magnetoresistance effect elements MTJ1 and MTJ2 (in other words, erasing stored data) by flowing a current through the spin-orbit torque wiring 31 may be included.

<Wiring and Substrate>

A wiring on the fixed layer 73 side of the magnetoresistance effect element MTJ2, for example, may be formed in a substrate. In addition, a wiring on the fixed layer 53 side of the magnetoresistance effect element MTJ1, for example, may be formed as being connected to a metal wiring layer (not illustrated in the drawing) disposed in a stacking film upper portion.

For example, it is preferable that the substrate has superior flatness. As a material of the substrate, for example, Si, AlTiC, or the like may be used. By using such a material, a surface having superior flatness is acquired.

It is preferable to dispose an insulating layer on the substrate. In such a case, a current flowing through a wiring or the like can be prevented from dispersing. As the insulating layer, for example, a layer, which has a (001)-oriented NaCl structure, of an oxide containing at least one element selected from among a group of Mg, Al, and Ce may be used. By using such a material as the material of the insulating layer, the crystallinity of the insulating layer is reflected on a stacking film stacked on the insulating layer, and the orientation of the crystals of the stacking film is improved. In addition, an insulating material of a nitride such as SiNx may be used as the material of the insulating layer.

On a face of the substrate disposed on the magnetoresistance effect element MTJ2 side, an underlayer may be formed. In a case in which the underlayer is disposed, the crystallinity of each layer including the fixed layer 73 stacked on the substrate such as a crystal orientation and a crystal grain size can be controlled.

For example, as one example of the underlayer, a layer of a nitride having a (001)-oriented NaCl structure and containing at least one element selected from among a group of Ti, Zr, Nb, V, Hf, Ta, Mo, W, B, Al, and Ce may be used.

As another example of the underlayer, a layer of a (002)-oriented conductive oxide of a Perovskite type represented using a compositional formula of $ABO_3$ may be used. Here, the site A includes at least one element selected from a group of Sr, Ce, Dy, La, K, Ca, Na, Pb, and Ba, and the site B includes at least one element selected from a group of Ti, V, Cr, Mn, Fe, Co, Ni, Ga, Nb, Mo, Ru, Ir, Ta, Ce, and Pb.

As another example of the underlayer, a layer having a (001)-oriented tetragonal crystal or cubic crystal structure and including at least one element selected from among a group of Al, Cr, Fe, Co, Rh, Pd, Ag, Ir, Pt, Au, Mo, and W may be used.

The underlayer is not limited to one layer, and each exemplary layer described above may be stacked to form a plurality of layers. By devising the configuration of the underlayer, the crystallinity of each layer of the magnetoresistance effect element MTJ2 is increased, and the magnetic characteristics can be improved. When the magnetoresistance effect element MTJ1 is stacked above the magnetoresistance effect element MTJ2 and the spin-orbit torque wiring 31, by maintaining flatness, the crystallinity of each layer of the magnetoresistance effect element MTJ1 is increased, and the magnetic characteristics are improved.

The wiring includes a wiring connected to the fixed layer 53 of the magnetoresistance effect element MTJ1, the spin-orbit torque wiring 31 interposed between the free layer 51 of the magnetoresistance effect element MTJ1 and the free layer 71 of the magnetoresistance effect element MTJ2, and a wiring connecting to the fixed layer 73 of the magnetoresistance effect element MTJ2, and the magnetoresistance effect elements MTJ1 and MTJ2 are electrically connected. In the example illustrated in FIG. 1, the wiring (in the example illustrated in FIG. 1, the wiring including the first transistor Tr1, the magnetoresistance effect element MTJ1, the spin-orbit torque wiring 31, the magnetoresistance effect element MTJ2, and the wiring including the second transistor Tr2) forms a closed circuit and induces a current to flow in the stacking direction of the magnetoresistance effect elements MTJ1 and MTJ2.

In addition, as a power supply, for example, a voltage generating circuit may be used.

The wiring is not particularly limited, as long as it uses a material having high conductivity. For example, aluminum, silver, copper, gold, or the like may be used as the material.

<Control Unit>

The unit magnetic memory 11 is controlled by a control unit (not illustrated in the drawing).

The control unit is electrically connected to first to fourth voltage generating circuits 151 to 154 (see FIG. 4 and the like), first to fourth switching circuits SW1 to SW4 (see FIG. 4 and the like), and the gate terminals of the first transistor Tr1 and the second transistor Tr2 and controls the connected components. For example, in order to use the SOT effect, the control unit operates the second voltage generating circuit 152 and the third voltage generating circuit 153 such that they generate desired voltages for the second switch SW2 and the third switch SW3 to be in the on state, thereby performing control such that a current flows through the spin-orbit torque wiring 31 (hereinafter, also referred to as an SOT current). In addition, in order to use the STT effect, the control unit operates the first and fourth voltage generating circuits 151 and 154 to generate desired voltages, for the first switch SW1 and the fourth switch SW4 to be in the on state, and for the gate terminals of the first transistor Tr1 and the second transistor Tr2 to be in the high state, thereby controlling a current to flow through the magnetoresistance effect elements MTJ1 and MTJ2 (hereinafter, also referred to as an "STT current").

The control unit controls an SOT current and an STT current with a time difference.

Initially, the control unit operates for the SOT current to flow through the spin-orbit torque wiring 31. The control unit has open/closed states of the second switch SW2 and the third switch SW3 and thus can control the SOT current.

The SOT current flows in a direction orthogonal to the stacking direction of the magnetoresistance effect elements MTJ1 and MTJ2.

Next, the control unit operates to flow the STT current through the wiring including the first transistor Tr1, the magnetoresistance effect element MTJ1, the spin-orbit torque wiring 31, the second magnetoresistance effect element MTJ2, and the wiring including the second transistor Tr2. The control unit has open/closed states of the first switch SW1 and the fourth switch SW4 and voltages applied to the gate terminals of the first transistor Tr1 and the second transistor Tr2 and thus can control the STT current. The STT current flows through the magnetoresistance effect elements MTJ1 and MTJ2 in the stacking direction.

<Arrangement of Two Magnetoresistance Effect Elements with Respect to Spin-Orbit Torque Wiring>

The arrangement of the two magnetoresistance effect elements MTJ1 and MTJ2 with respect to the spin-orbit torque wiring 31 will be described.

In this embodiment, the faces of the free layers 51 and 71 of the two magnetoresistance effect elements MTJ1 and MTJ2 are respectively bonded to two faces of the spin-orbit torque wiring 31 facing each other.

An arrangement is used in which at least parts of junction faces of the two magnetoresistance effect elements MTJ1 and MTJ2 for the spin-orbit torque wiring 31 (in this embodiment, junction faces of the free layers 51 and 71) overlap with each other when seen in a direction perpendicular to two faces of the spin-orbit torque wiring 31 facing each other (in this embodiment, the stacking direction of the two magnetoresistance effect elements MTJ1 and MTJ2). Preferably, an arrangement is used in which the junction faces of the two magnetoresistance effect elements MTJ1 and MTJ2 for the spin-orbit torque wiring 31 (in this embodiment, the junction faces of the free layers 51 and 71) coincide with each other when seen in a direction perpendicular to the two faces of the spin-orbit torque wiring 31 facing each other (in this embodiment, the stacking direction of the two magnetoresistance effect elements MTJ1 and MTJ2).

In accordance with such an arrangement, a current (STT current) passing through the two magnetoresistance effect elements MTJ1 and MTJ2 flows.

<Method of Manufacturing Magnetic Memory>

One example of a method of manufacturing a structure in which two magnetoresistance effect elements MTJ1 and MTJ2 are vertically stacked in the unit magnetic memory 11 will be illustrated.

In addition, the method of manufacturing the unit magnetic memory 11 is not limited thereto, and another arbitrary method may be used.

It is preferable that a substrate used for manufacturing a magnetic memory has superior flatness. In order to acquire a surface having superior flatness, for example, Si, AlTiC, or the like may be used as the material of the substrate. It is preferable to dispose a semiconductor circuit on the substrate. The semiconductor circuit is a circuit used for driving the magnetic memory. On a substrate in which wirings are patterned, a fixed layer 73, a nonmagnetic layer 72, and a free layer 71 of a magnetoresistance effect element MTJ2 are formed. After the layers are processed into the shape of a magnetic memory cell using photolithography, a spin-orbit torque wiring 31 is formed. At this time, an interlayer insulating film is formed in a portion disposed at the same height as that of the spin-orbit torque wiring 31 using a semiconductor process. After, the interlayer insulating layer and the spin-orbit torque wiring 31 are flattened through chemical mechanical planarization (CMP), a free layer 51, a nonmagnetic layer 52, and a fixed layer 53 of a magnetoresistance effect element MTJ1 are sequentially stacked. In addition, an underlayer may be disposed between the substrate and the fixed layer 73. In a case in which the underlayer is disposed, the crystallinity of each layer including the fixed layer 73 stacked on the substrate such as crystal orientation and a crystal grain size can be controlled.

Such layers, for example, may be formed using a magnetron sputter device. In a case in which the magnetoresistance effect element MTJ2 is a TMR element, for example, a tunnel barrier layer is formed by, first, sputtering about 0.4 to 2.0 nm of aluminum and a plurality of metal thin films of bivalent positive ions of nonmagnetic elements on the fixed layer 73, naturally oxidizing the metal films through plasma oxidation or introduction of oxygen, and performing a thermal treatment thereafter. As a method of forming films, a thin film forming method such as an evaporation method, a laser ablation method, or a molecular beam epitaxy (MBE) method other than a magnetron sputtering method may be used.

While it is preferable to form the spin-orbit torque wiring 31 in the extending direction with a high accuracy, in order to avoid a level difference in an underlayer face, bending according to wiring routing, and the like and to decrease the resistance of the spin-orbit torque wiring 31, the spin-orbit torque wiring 31 may be assisted using a metal wiring as is necessary. As the material of the metal wiring, a material having high conductivity such as aluminum, silver, copper, or gold may be used without any problem.

Next, after an insulating material such as $Al_2O_3$ or $SiO_2$ is buried in the vicinity of the spin-orbit torque wiring 31, the face is flattened. By flattening the face, a voltage can be uniformly applied to the tunnel barrier layer of the magnetoresistance effect element MTJ1, and an output of a magnetic resistance ratio or the like and the durability of the element can be improved.

In addition, as a control element, for example, a switching element such as a transistor may be produced using a known method. In a case in which a substrate to be produced, for example, is a semiconductor such as silicon, several control elements may be produced on the same substrate.

[Basic Configuration of Magnetic Memory]

Figure 4:
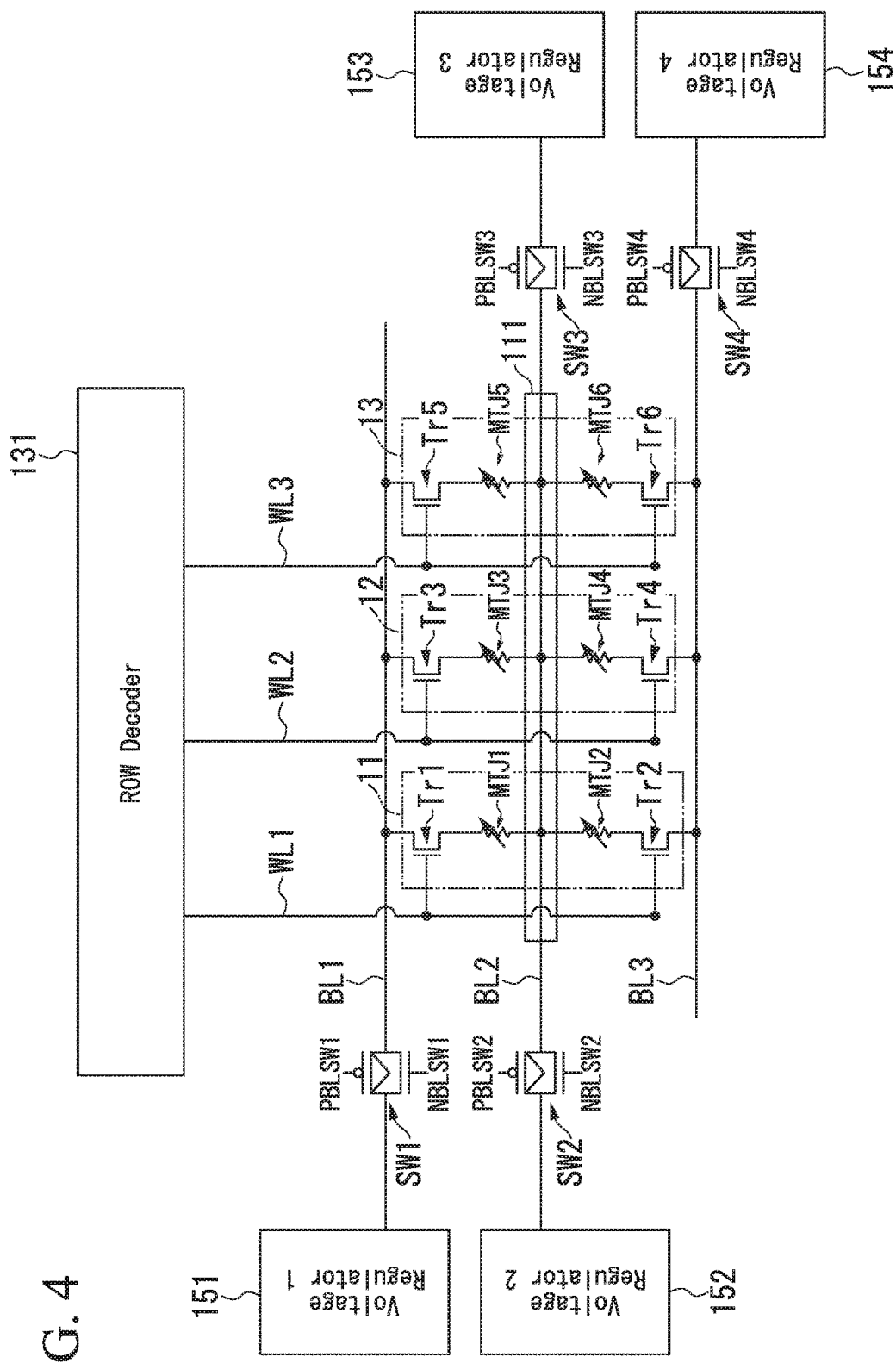
FIG. 4 is a diagram illustrating the basic configuration of a magnetic memory according to an embodiment of the present disclosure.

FIG. 4 is a diagram illustrating the basic configuration of a magnetic memory M according to an embodiment of the present disclosure.

The magnetic memory M is configured to include a plurality of (three in this example) magnetic memories of unit cells (a first unit magnetic memory 11, a second unit magnetic memory 12, and a third unit magnetic memory 13).

In this embodiment, a spin-orbit torque wiring (the spin-orbit torque wiring 31 in the example illustrated in FIG. 1) of three unit magnetic memories (the first unit magnetic memory 11, the second unit magnetic memory 12, and the third unit magnetic memory 13) is common to one spin-orbit torque wiring 111. In addition, the three unit magnetic memories (the first unit magnetic memory 11, the second unit magnetic memory 12, and the third unit magnetic memory 13) are connected in series along the common spin-orbit torque wiring 111.

In addition, the magnetic memory M includes extending three bit lines (a first bit line BL1, a second bit line BL2, and a third bit line BL3), extending three word lines (a first word line WL1, a second word line WL2, and a third word line WL3), four switching circuits (a first switching circuit SW1, a second switching circuit SW2, a third switching circuit SW3, and a fourth switching circuit SW4), four voltage generating circuits (a first voltage generating circuit 151, a second voltage generating circuit 152, a third voltage generating circuit 153, and a fourth voltage generating circuit 154), and one row decoder 131.

The configuration of the first unit magnetic memory 11 is similar to the configuration illustrated in FIG. 1 except that the spin-orbit torque wiring 31 is replaced with the spin-orbit torque wiring 111.

The configuration of the second unit magnetic memory 12 is similar to the configuration of the first unit magnetic memory 11 and includes two magnetoresistance effect elements (a first magnetoresistance effect element MTJ3 and a second magnetoresistance effect element MTJ4) and two transistors (a first transistor Tr3 and a second transistor Tr4).

The configuration of the third unit magnetic memory 13 is similar to the configuration of the first unit magnetic memory 11 and includes two magnetoresistance effect elements (a first magnetoresistance effect element MTJ5 and a second magnetoresistance effect element MTJ6) and two transistors (a first transistor Tr5 and a second transistor Tr6).

In the first transistor Tr1 of the first unit magnetic memory 11, a gate (g) terminal is connected to a first word line WL1.

In the first transistor Tr3 of the second unit magnetic memory 12, a gate (g) terminal is connected to a second word line WL2.

In the first transistor Tr5 of the third unit magnetic memory 13, a gate (g) terminal is connected to a third word line WL3.

In the first transistors Tr1, Tr3, and Tr5 of the three unit magnetic memories (the first unit magnetic memory 11, the second unit magnetic memory 12, and the third unit magnetic memory 13), source (s) terminals are respectively connected to faces of fixed layers (in the example illustrated in FIG. 1, the fixed layer 53) of the first magnetoresistance effect elements MTJ1, MTJ3, and MTJ5, and drain (d) terminals are connected to a first bit line BL1.

In the second transistor Tr2 of the first unit magnetic memory 11, a gate (g) terminal is connected to the first word line WL1.

In the second transistor Tr4 of the second unit magnetic memory 12, a gate (g) terminal is connected to the second word line WL2.

In the second transistor Tr6 of the third unit magnetic memory 13, a gate (g) terminal is connected to the third word line WL3.

In the second transistors Tr2, Tr4, and Tr6 of the three unit magnetic memories (the first unit magnetic memory 11, the second unit magnetic memory 12, and the third unit magnetic memory 13), drain (d) terminals are connected to faces of fixed layers (the fixed layer 73 in the example illustrated in FIG. 1) of the second magnetoresistance effect elements MTJ2, MTJ4, and MTJ6, and source (s) terminals are connected to the third bit lines BL3.

The spin-orbit torque wiring 111 is used as the second bit line BL2.

In the first bit line BL1, the first unit magnetic memory 11 side is connected to the first voltage generating circuit 151 through the first switching circuit SW1.

In the second bit line BL2, the first unit magnetic memory 11 side is connected to the second voltage generating circuit 152 through the second switching circuit SW2.

In the second bit line BL2, the third unit magnetic memory 13 side is connected to the third voltage generating circuit 153 through the third switching circuit SW3.

In the third bit line BL3, the third unit magnetic memory 13 side is connected to the fourth voltage generating circuit 154 through the fourth switching circuit SW4.

In the three word lines (the first word line WL1, the second word line WL2, and the third word line WL3), the first transistor Tr1, Tr3, and Tr5 side is connected to the row decoder 131.

The row decoder 131 controls voltages applied to the word lines (the first word line WL1, the second word line WL2, and the third word line WL3).

Here, in this embodiment, each of the switching circuits SW1 to SW4 is configured by combining a negative channel metal oxide semiconductor (NMOS) and a positive channel metal oxide semiconductor (PMOS). As the configurations of the switching circuits SW1 to SW4, different configurations may be used.

In addition, the voltage generating circuits 151 to 154, the switching circuits SW1 to SW4, and the like, for example, are controlled by a control unit (not illustrated in the drawing).

In addition, in this embodiment, a plurality of the bit lines BL1 to BL3 are disposed in parallel with each other.

Furthermore, in this embodiment, a plurality of word lines WL1 to WL3 are disposed in parallel with each other.

In addition, in this embodiment, a plurality of the unit magnetic memories 11 to 13 are disposed to be aligned at constant intervals (distance intervals) in a linear shape.

[Complementary Magnetic Memory]

Figure 5:
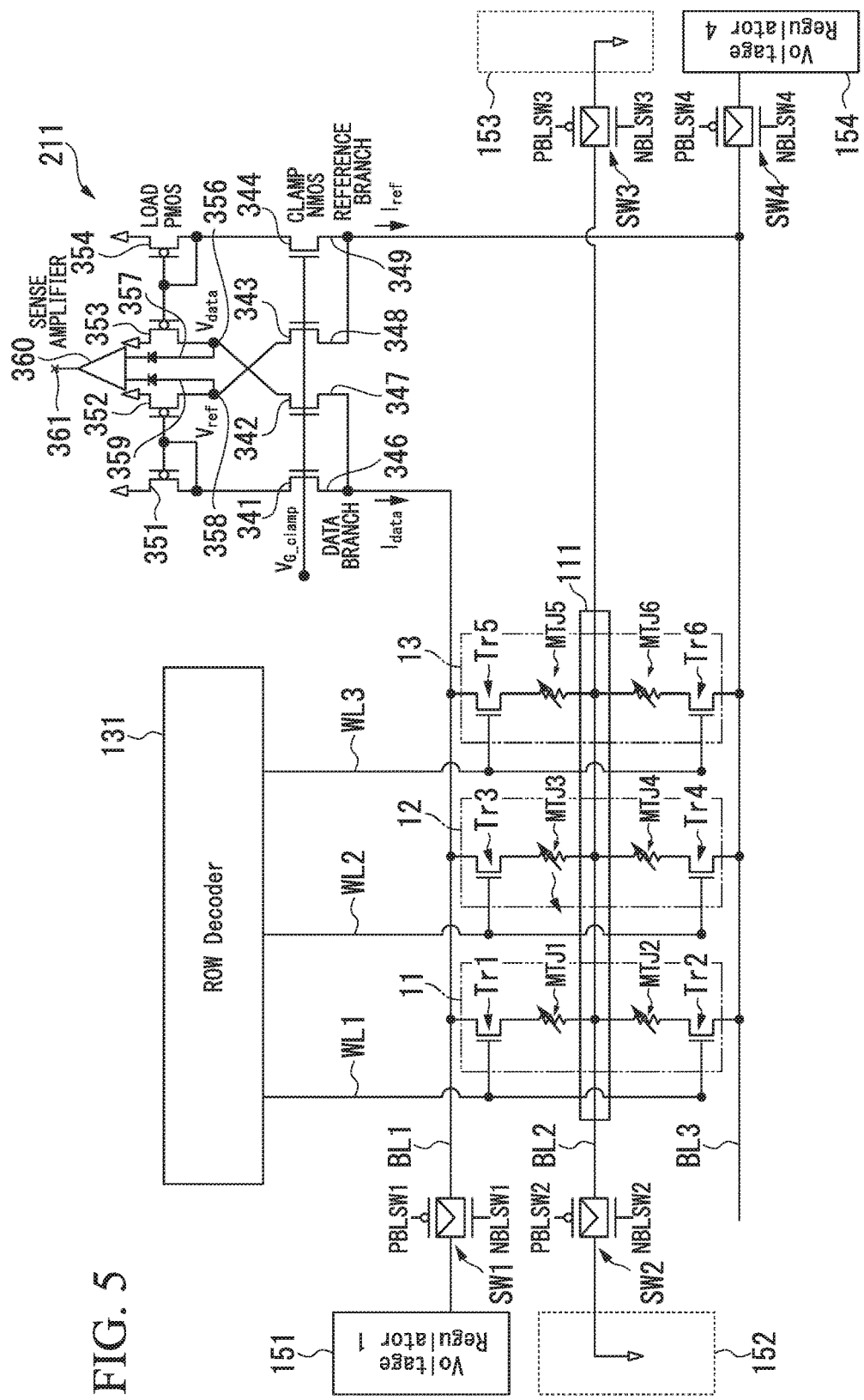
FIG. 5 is a diagram illustrating an example of a reading operation in a complementary magnetic memory according to an embodiment of the present disclosure.

FIG. 5 is a diagram illustrating an example of a reading operation in a complementary magnetic memory M1 according to an embodiment of the present disclosure.

The complementary magnetic memory M1 uses the basic configuration of the magnetic memory M illustrated in FIG. 4 and includes a differential reading circuit 211 between a first bit line BL1 and a third bit line BL3.

In addition, sides of three word lines (a first word line WL1, a second word line WL2, and a third word line WL3) that are opposite to a row decoder 131 and the first unit magnetic memory 11 side of the third bit line BL3 are terminated.

In the complementary magnetic memory M1, one of unit magnetic memories 11 to 13 is a minimal memory cell (a unit cell that stores data).

<Data Writing>

In the complementary magnetic memory M1, by applying a predetermined voltage to each of the first bit line BL1 and the third bit line BL3 and applying a predetermined voltage to one arbitrary word line among three word lines (the first word line WL1, the second word line WL2, and the third word line WL3), one unit magnetic memory corresponding to the word line (one of the three unit magnetic memories 11 to 13) is selected, and data can be written in the unit magnetic memory. In this example, the data is binary data and have a value of "1" or "0."

Here, in this example, in the unit magnetic memories 11 to 13, values of data stored in the first magnetoresistance effect elements MTJ1, MTJ3, and MTJ5 and values of data stored in the second magnetoresistance effect elements MTJ2, MTJ4, and MTJ6 are the same.

<Data Reading>

In the complementary magnetic memory M1, by applying a predetermined voltage to each of the first bit line BL1 and the third bit line BL3 and applying a predetermined voltage to one arbitrary word line among three word lines (the first word line WL1, the second word line WL2, and the third word line WL3), one unit magnetic memory corresponding to the word line (one of the three unit magnetic memories 11 to 13) is selected, and a value of data written (data stored) in the selected unit magnetic memory can be read.

Here, in this example, data having a value "1" or "0" is read from each of the unit magnetic memories 11 to 13.

Schematically, in accordance with a value of data stored in the selected one unit magnetic memory, a current input to the differential reading circuit 211 changes, and accordingly, a current output from the differential reading circuit 211 changes. Then, in a control circuit or the like controlling the magnetic memory M1, on the basis of a current output from the differential reading circuit 211, a value of data stored in the selected one unit magnetic memory can be determined.

Here, as the differential reading circuit 211, a circuit having an arbitrary configuration may be used. In this example, the differential reading circuit 211 includes two wirings 346 and 347 branching from the first bit line BL1 into two parts, an NMOS 341 connected to the wiring 346, an NMOS 342 connected to the wiring 347, and a PMOS 351 connected to the NMOS 341.

In addition, the differential reading circuit 211 includes two wirings 348 and 349 branching from the third bit line BL3 into two parts, an NMOS 343 connected to the wiring 348, an NMOS 344 connected to the wiring 349, and a PMOS 354 connected to the NMOS 344.

In addition, the differential reading circuit 211 includes a PMOS 353 connected to the NMOS 342, a PMOS 352 connected to the NMOS 343, a wiring 357 connected to a connection point 356 between the NMOS 342 and the PMOS 353, a wiring 359 connected to a connection point 358 between the NMOS 343 and the PMOS 352, and an amplifier 360 having two input terminals to which the two wirings 357 and 359 are connected. The amplifier 360 is a differential amplifier.

In the differential reading circuit 211, a current $I_{data}$ flowing through the first bit line BL1 is a current corresponding to a value of data stored in the selected unit magnetic memory, a current $I_{ref}$ flowing through the third bit line BL3 is a reference current, a voltage $V_{data}$ of the connection point 356 is a voltage corresponding to the value of the data, and a voltage $V_{ref}$ of the connection point 358 is a voltage corresponding to the reference value. Accordingly, a voltage corresponding to the value of the data is output from an output terminal 361 of the amplifier 360.

<Configuration Including Four or More Unit Magnetic Memories>

Here, a configuration including four or more unit magnetic memories will be illustrated.

Figure 6:
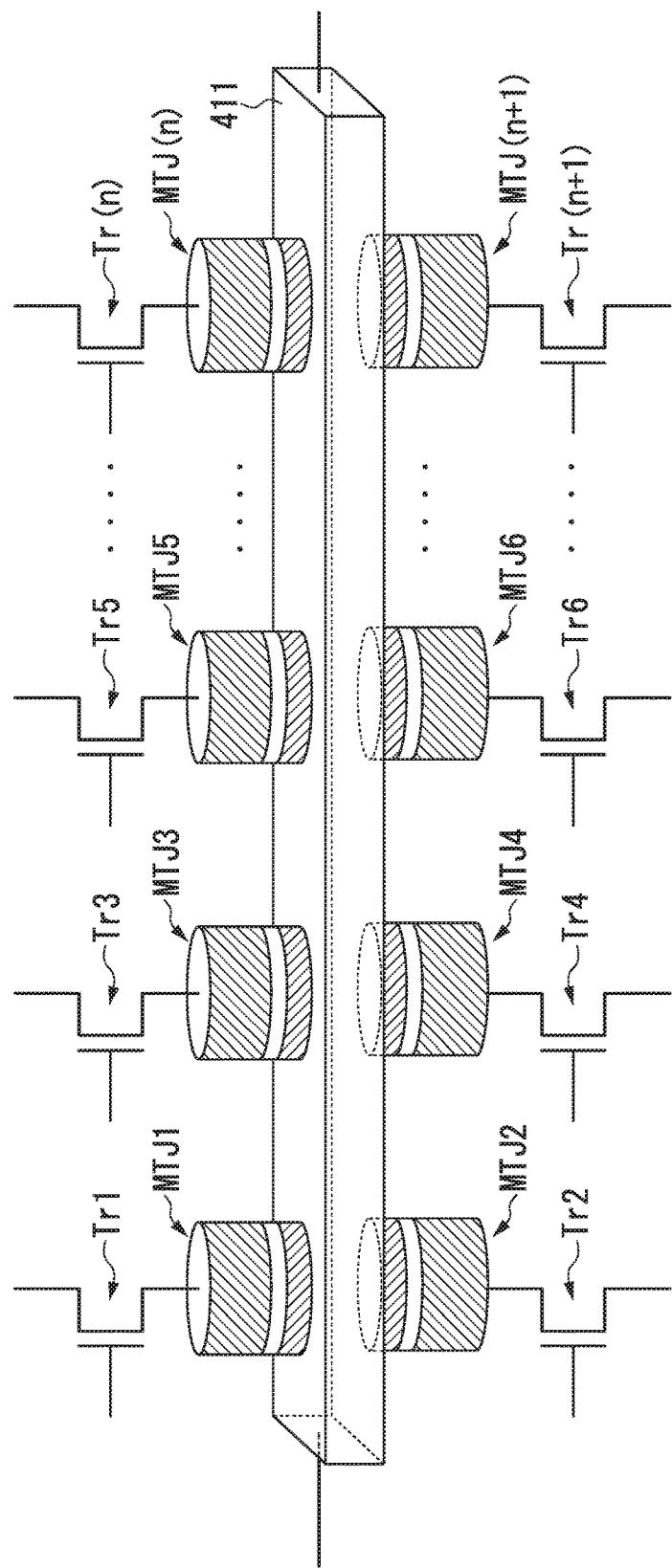
FIG. 6 is a diagram illustrating a configuration including four or more unit magnetic memories according to an embodiment of the present disclosure.

FIG. 6 is a diagram illustrating a configuration including four or more unit magnetic memories according to an embodiment of the present disclosure.

In this example, {(n+1)/2} unit magnetic memories in which n is an odd number of "7" or more are disposed in series for a common spin-orbit torque wiring 411.

<Voltage Signal in Complementary Magnetic Memory>

Figure 7:
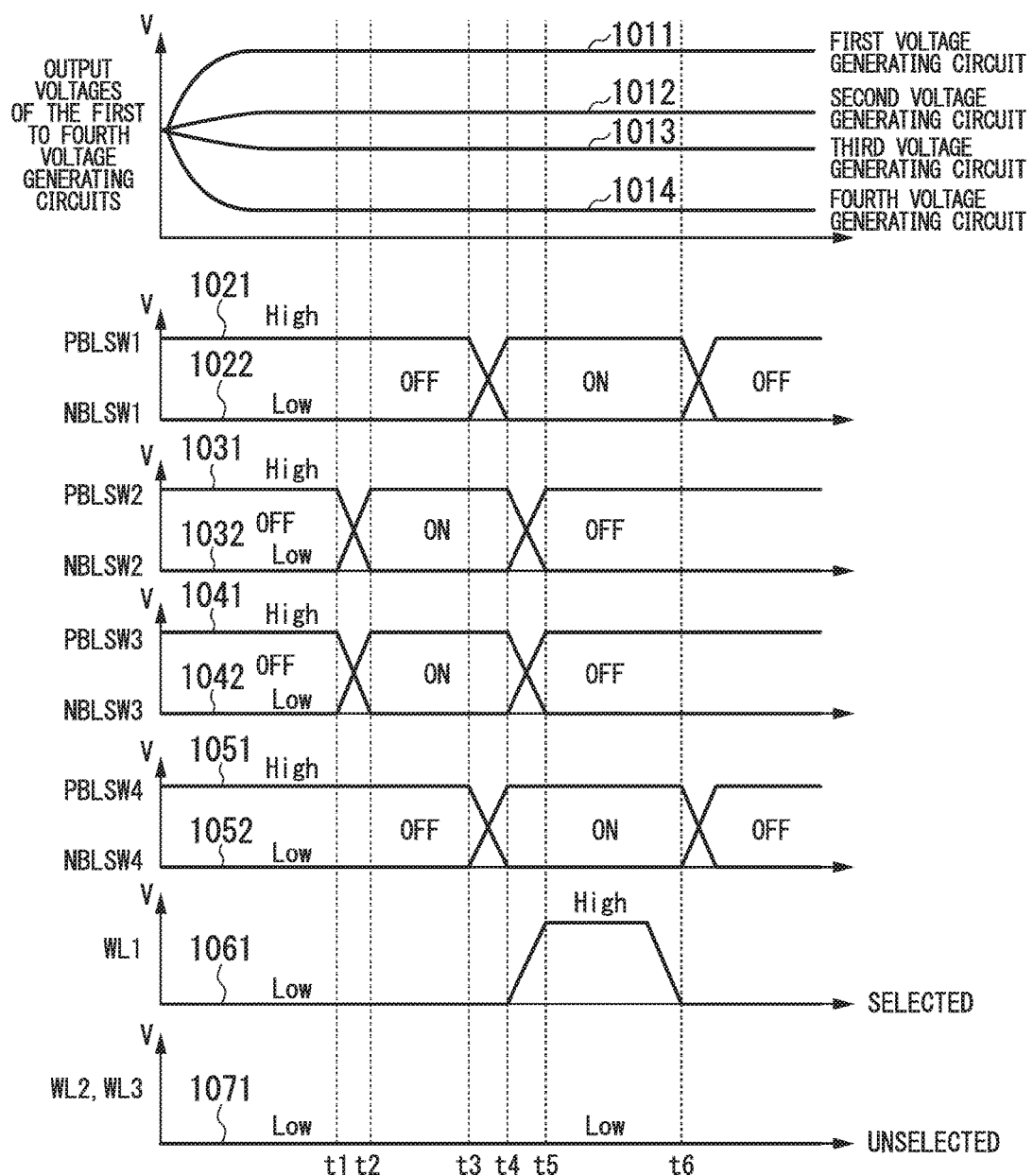
FIG. 7 is a diagram illustrating an example of a voltage of each unit in a complementary magnetic memory according to an embodiment of the present disclosure.

FIG. 7 is a diagram illustrating an example of a voltage of each unit in a complementary magnetic memory M1 according to an embodiment of the present disclosure.

FIG. 7 illustrates voltages 1011 to 1014 respectively output from four voltage generating circuits 151 to 154, voltages of a first switching circuit SW1 that are inverted from each other (a voltage 1021 of PBLSW1 and a voltage 1022 of NBLSW1), voltages of a second switching circuit SW2 that are inverted from each other (a voltage 1031 of PBLSW2 and a voltage 1032 of NBLSW2), voltages of a third switching circuit SW3 that are inverted from each other (a voltage 1041 of PBLSW3 and a voltage 1042 of NBLSW3), voltages of a fourth switching circuit SW4 that are inverted from each other (a voltage 1051 of PBLSW4 and a voltage 1052 of NBLSW4), a voltage 1061 applied to a first word line WL1, and a voltage 1071 applied to a second word line WL2 and a third word line WL3.

Here, PBLSW1 to PBLSW4 respectively represent voltages applied to gate (g) terminals of PMOSs of the switching circuits SW1 to SW4. In addition, NBLSW1 to NBLSW4 respectively represent voltages applied to gate (g) terminals of NMOSs of the switching circuits SW1 to SW4.

In each thereof, the vertical axis represents the voltage, and the horizontal axis represents a time interval (time).

In this example, the voltages inverted from each other are a high voltage that is a constant voltage of the high side and a low voltage that is a constant voltage of the low side.

In addition, the voltage applied to the second word line WL2 and the voltage applied to the third word line WL3 are the same voltage (the voltage 1071).

In this example, for the convenience of description, times t1 to t6 aligned in the order of a time series are illustrated.

The voltage 1011 of the first voltage generating circuit 151 and the voltage 1014 of the fourth voltage generating circuit 154 are voltages having differences in opposite directions of positive and negative directions with respect to a reference voltage (for example, 0 [V]). In this example, the voltage 1011 of the first voltage generating circuit 151 is higher than the voltage 1014 of the fourth voltage generating circuit 154.

The voltage 1012 of the second voltage generating circuit 152 and the voltage 1013 of the third voltage generating circuit 153 are voltages having differences in opposite directions of positive and negative directions with respect to a reference voltage (for example, 0 [V]). In this example, the voltage 1012 of the second voltage generating circuit 152 is higher than the voltage 1013 of the third voltage generating circuit 153.

In this example, a difference (absolute value) between the voltage 1011 of the first voltage generating circuit 151 and the voltage 1014 of the fourth voltage generating circuit 154 is larger than a difference (absolute value) between the voltage 1012 of the second voltage generating circuit 152 and the voltage 1013 of the third voltage generating circuit 153

In this way, in this example, a difference between the voltages of the second voltage generating circuit 152 and the third voltage generating circuit 153 is smaller than a difference between the voltages of the first voltage generating circuit 151 and the fourth voltage generating circuit 154. In addition, the voltage of the first voltage generating circuit 151 is set to be higher toward the positive side than the voltage of the second voltage generating circuit 152 and the voltage of the third voltage generating circuit 153. Furthermore, the voltage of the fourth voltage generating circuit 154 is set to be lower toward the negative side than the voltage of the second voltage generating circuit 152 and the voltage of the third voltage generating circuit 153.

Here, in this embodiment, as a state of each of the switching circuits SW1 to SW4, an on-state represents a state in which both ends of each of the switching circuits SW1 to SW4 is connected, and an off-state represents a state in which both ends of each of the switching circuits SW1 to SW4 are open (a state in which the both ends are not connected).

In addition, in this embodiment, as a voltage state of each of the word lines WL1 to WL3, a low-voltage state represents a state in which the word line is not selected, and a high-voltage state is a state in which the word line is selected.

The state of the first switching circuit SW1 is off up to the time t3, changes to on over the time t3 to the time t4, and changes to off from the time t6.

The state of the second switching circuit SW2 is off up to the time t1, changes to on over the time t1 to the time t2, and changes to off over the time t4 to the time t5.

The state of the third switching circuit SW3 is off up to the time t1, changes to on over the time t1 to the time t2, and changes to off over the time t4 to the time t5.

The state of the fourth switching circuit SW4 is off up to the time t3, changes to on over the time t3 to the time t4, and changes to off from the time t6.

A voltage state of the first word line WL1 is the low state up to the time t4, changes to high state over the time t4 to the time t5, and changes to the low state over before the time t6 to the time t6.

Both the voltage state of the second word line WL2 and the voltage state of the third word line WL3 are maintained as being the low state.

In the example illustrated in FIG. 7, the first unit magnetic memory 11 corresponding to the first word line WL1 is selected for rewriting data.

In addition, in this example, an SOT current flowing in accordance with the second switching circuit SW2 and the third switching circuit SW3 flows first (in other words, early in time), and thereafter, an STT current flowing in accordance with the first switching circuit SW1 and the fourth switching circuit SW4 flows later (in other words, late in time).

In this example, a duration (time width) in which the STT current flows in accordance with the first switching circuit SW1 and the fourth switching circuit SW4 is longer than a duration (time width) in which the SOT current flows in accordance with the second switching circuit SW2 and the third switching circuit SW3.

In this example, a voltage applied for flowing the STT current is higher than a voltage applied for flowing the SOT current.

In this example, by applying a voltage between both ends of the spin-orbit torque wiring 111 (between the second switching circuit SW2 and the third switching circuit SW3), the influence of a current leaking to the spin-orbit torque wiring 111 is decreased.

Figure 8:
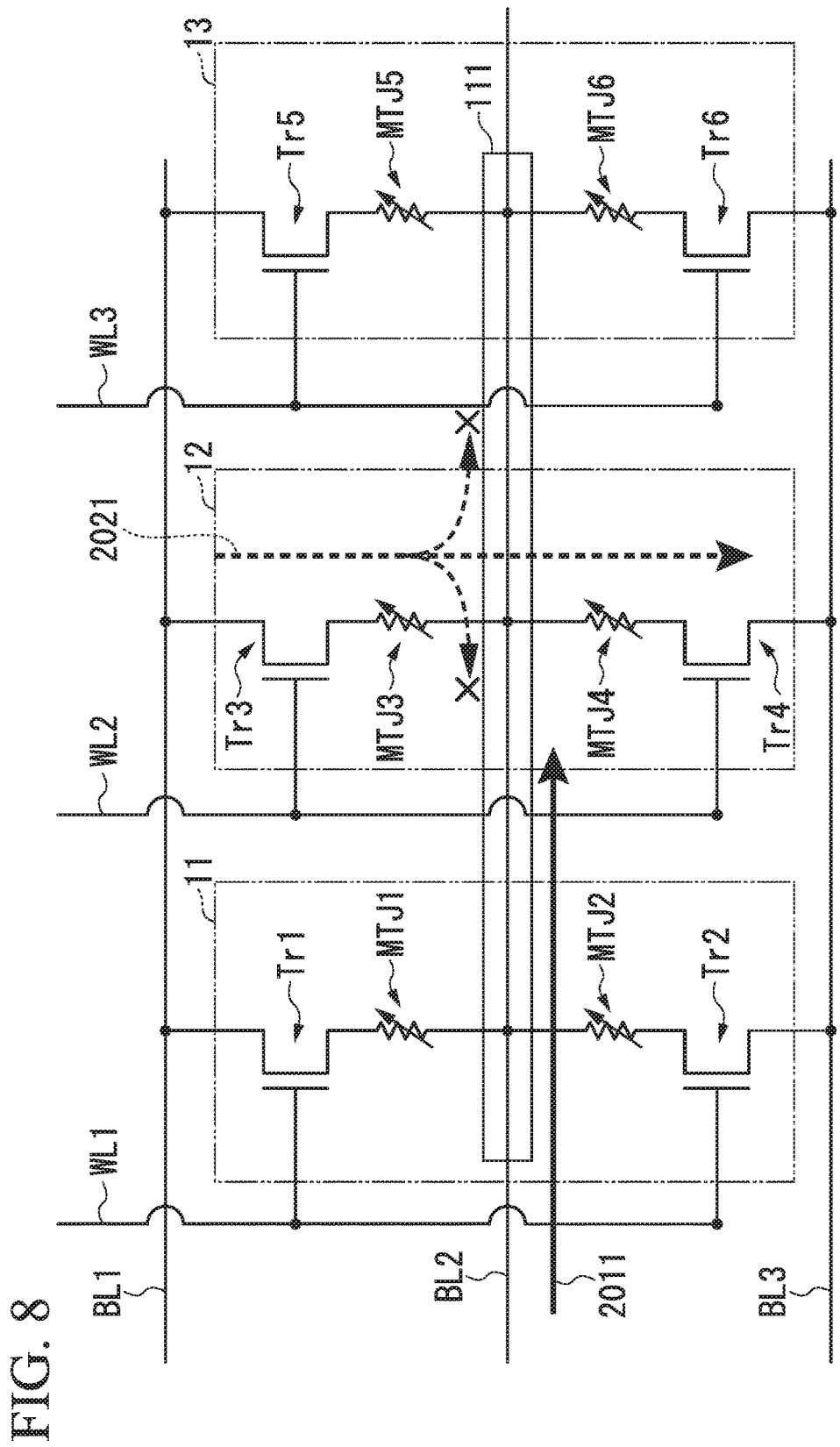
FIG. 8 is a diagram illustrating an example of a writing operation in a complementary magnetic memory according to an embodiment of the present disclosure.

FIG. 8 is a diagram illustrating an example of a writing operation in a complementary magnetic memory M1 according to an embodiment of the present disclosure.

In the example illustrated in FIG. 8, a case in which a writing operation is performed for the second unit magnetic memory 12 is illustrated. In this case, an SOT current 2011 flows through the spin-orbit torque wiring 111, and an STT current 2021 consistently flows in the stacking direction of the first magnetoresistance effect element MTJ3 and the stacking direction of the second magnetoresistance effect element MTJ4 in the second unit magnetic memory 12, whereby a writing operation is performed. A current leaking from the STT current 2021 to the spin-orbit torque wiring 111 decreases (ideally, zero).

In the complementary magnetic memory M1 as illustrated in FIG. 5, in each of the unit magnetic memories 11 to 13, the identical data is written in two magnetoresistance effect elements (for example, the two magnetoresistance effect elements MTJ1 and MTJ2 or the like). For this reason, in a case in which a value of data written in each of the unit magnetic memories 11 to 13 is read, the differential reading circuit 211, for example, compared to a case in which data is written and read only for one magnetoresistance effect element (the magnetoresistance effect element of one side) in each of the unit magnetic memories 11 to 13, can perform detection at a double voltage theoretically.

For this reason, in the complementary magnetic memory M1, a writing margin and a reading margin can be increased, and accordingly, the complementary magnetic memory M1 is strong against noise, and increases in the speeds of the writing process and the reading process can be achieved.

In the complementary magnetic memory M1 as illustrated in FIG. 5, in each of the unit magnetic memories 11 to 13, for example, one of data "0" and data "1" can be stored.

In addition, in the complementary magnetic memory M1 as illustrated in FIG. 5, in each of the unit magnetic memories 11 to 13, values of data complementarily written in two magnetoresistance effect elements (for example, the two magnetoresistance effect elements MTJ1 and MTJ2 or the like) can be read through the first bit line BL1 and the third bit line BL3 as differential pair memories.

In the complementary magnetic memory M1 as illustrated in FIG. 5, data reading and data writing can be performed complementarily, and, for example, a high-speed access of 10 [ns] or less, which is a characteristic of an MRAM using the SOT, can be achieved.

In addition, in the complementary magnetic memory M1, by flowing an STT current through a heavy metal in the vertical direction, a writing margin and a reading margin can be improved, a leakage current can be decreased, and accordingly, the memory operation can be stabilized.

[Both-Side Independent-Type Magnetic Memory]

Figure 9:
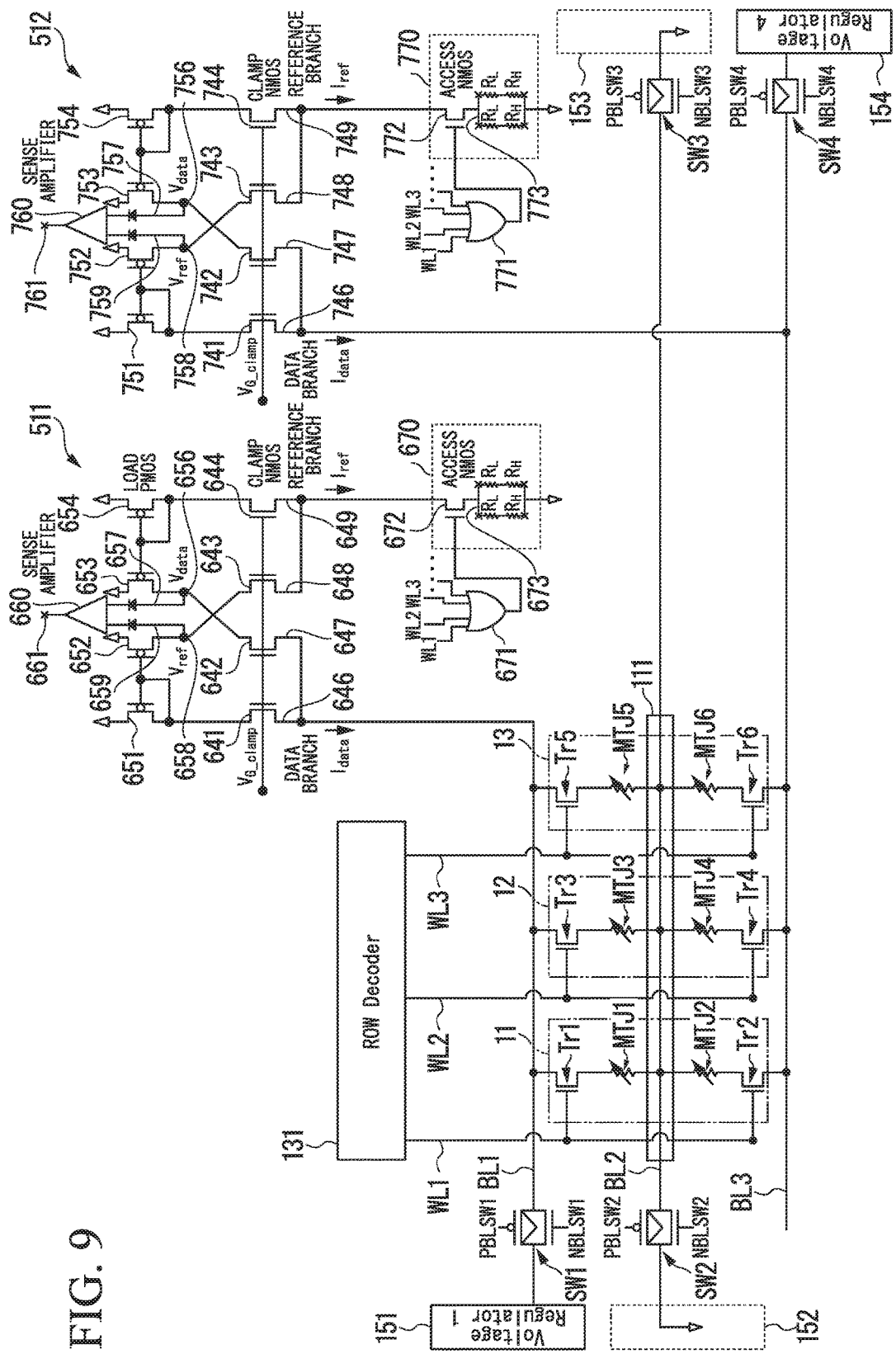
FIG. 9 is a diagram illustrating an example of a reading operation in a both-side independent-type magnetic memory according to an embodiment of the present disclosure.

FIG. 9 is a diagram illustrating an example of a reading operation in a both-side independent-type magnetic memory M2 according to an embodiment of the present disclosure.

The both-side independent-type magnetic memory M2 uses the basic configuration of the magnetic memory M illustrated in FIG. 4 and, additionally, includes a first differential reading circuit 511 in a first bit line BL1 and includes a second differential reading circuit 512 in a third bit line BL3.

In addition, sides of three word lines (a first word line WL1, a second word line WL2, and a third word line WL3) that are opposite to a row decoder 131 and the first unit magnetic memory 11 side of the third bit line BL3 are terminated.

In the both-side independent-type magnetic memory M2, each one of the magnetoresistance effect elements MTJ1 to MTJ6 is a minimal memory cell (a unit cell that stores data).

<Data Writing>

In the both-side independent-type magnetic memory M2, by applying a predetermined voltage to each of the first bit line BL1 and the third bit line BL3, in such a case, one voltage being set to 0 [V], and applying a predetermined voltage to one arbitrary word line among three word lines (the first word line WL1, the second word line WL2, and the third word line WL3), one magnetoresistance effect element in one unit magnetic memory corresponding to the word line (one magnetoresistance effect element out of two magnetoresistance effect elements MTJ1 to MTJ6 in one of three unit magnetic memories 11 to 13) is selected, and data can be written in the selected magnetoresistance effect element. In this example, the data is binary data and have a value of "1" or "0."

Here, in this example, in the unit magnetic memories 11 to 13, values of data stored in the first magnetoresistance effect elements MTJ1, MTJ3, and MTJ5 and values of data stored in the second magnetoresistance effect elements MTJ2, MTJ4, and MTJ6 can be independently controlled.

<Data Reading>

In both-side independent-type magnetic memory M2, by applying a predetermined voltage to each of the first bit line BL1 and the third bit line BL3 and applying a predetermined voltage to one arbitrary word line among three word lines (the first word line WL1, the second word line WL2, and the third word line WL3), one magnetoresistance effect element in one magnetoresistance effect element in one unit magnetic memory corresponding to the word line (one magnetoresistance effect element out of two magnetoresistance effect elements MTJ1 to MTJ6 of one of the three unit magnetic memories 11 to 13) is selected, and a value of data written (data stored) in the selected magnetoresistance effect element can be read. Here, in this example, data having a value "1" or "0" is read from each of the magnetoresistance effect elements MTJ1 to MTJ6.

Here, in this example, by applying a non-zero voltage to the first bit line BL1 and applying 0 [V] to the third bit line BL3, a writing operation or a reading operation for the first magnetoresistance effect element MTJ1, MTJ3, and MTJ5 can be performed.

In addition, in this example, by applying a non-zero voltage to the third bit line BL3 and applying 0 [V] to the first bit line BL1, a writing operation or a reading operation for the second magnetoresistance effect element MTJ2, MTJ4, and MTJ6 can be performed.

Schematically, for the first magnetoresistance effect elements MTJ1, MTJ3, and MTJ5, in accordance with a value of data stored in the selected one magnetoresistance effect element, a current input to the differential reading circuit 511 changes, and accordingly, a current output from the differential reading circuit 511 changes. Then, in a control circuit or the like controlling the magnetic memory M2, on the basis of a current output from the differential reading circuit 511, a value of data stored in the selected one magnetoresistance effect element can be determined.

Similarly, for the second magnetoresistance effect elements MTJ2, MTJ4, and MTJ6, in accordance with a value of data stored in the selected one magnetoresistance effect element, a current input to the differential reading circuit 512 changes, and accordingly, a current output from the differential reading circuit 512 changes. Then, in a control circuit or the like controlling the magnetic memory M2, on the basis of a current output from the differential reading circuit 512, a value of data stored in the selected one magnetoresistance effect element can be determined.

Here, as each of the differential reading circuits 511 and 512, a circuit having an arbitrary configuration may be used.

In this example, the configuration of the differential reading circuit 511 is different from the configuration of the differential reading circuit 211 illustrated in FIG. 9 in that a current flowing through a predetermined reference unit 670 is used as the reference current $I_{ref}$ and is similar thereto in the other points.

First, the differential reading circuit 511 includes, as constituent units similar to those of the differential reading circuit 211 illustrated in FIG. 9, two wirings 646 and 647, two NMOSs 641 and 642, one PMOS 651, two wirings 648 and 649, two NMOSs 643 and 644, and one PMOS 654.

In addition, the differential reading circuit 511 includes one PMOS 652, one PMOS 653, a wiring 657 connected to a connection point 656, a wiring 659 connected to a connection point 658, and an amplifier 660 having two input terminals to which the two wirings 657 and 659 are connected. The amplifier 660 is a differential amplifier.

In the differential reading circuit 511, a current $I_{data}$ flowing through the first bit line BL1 is a current corresponding to a value of data stored in the selected magnetoresistance effect element (one of three first magnetoresistance effect elements MTJ1, MTJ3, and MTJ5), a voltage $V_{data}$ of the connection point 656 is a voltage corresponding to the value of the data, and the voltage $V_{ref}$ of the connection point 658 is a voltage corresponding to the reference current $I_{ref}$. Accordingly, a voltage corresponding to the value of the data is output from an output terminal 661 of the amplifier 660.

In addition, the reference unit 670 includes a resistance part 673 connected to a predetermined voltage, and an NMOS 672 connected between the resistance part 673 and a reference branching point (a connection point between two wirings 648 and 649).

In addition, an output terminal of an OR circuit 671 is connected to a gate (g) of the NMOS 672. In this example, voltages applied to three word lines WL1 to WL3 are respectively applied to three input terminals of the OR circuit 671.

In a case in which a high voltage is applied to at least one of the three word lines WL1 to WL3, the OR circuit 671 sets the gate (g) of the NMOS 672 as being high, thereby flowing a reference current $I_{ref}$ to the reference branching point (the connection point between the two wirings 648 and 649). On the other hand, in a case in which a low voltage is applied to all the three word lines WL1 to WL3, the OR circuit 671 sets the gate (g) of the NMOS 672 as being low, thereby preventing the reference current $I_{ref}$ from flowing to the reference branching point (the connection point between the two wirings 648 and 649).

As voltages applied to the OR circuit 671, for example, voltages may branch from the word lines WL1 to WL3, or the same voltages as voltages applied to the word lines WL1 to WL3 by the row decoder 131 may be applied.

In this example, the configuration of the differential reading circuit 512 is similar to the configuration of the differential reading circuit 511.

First, the differential reading circuit 512 includes, as constituent units similar to those of the differential reading circuit 211 illustrated in FIG. 9, two wirings 746 and 747, two NMOSs 741 and 742, one PMOS 751, two wirings 748 and 749, two NMOSs 743 and 744, and one PMOS 754.

In addition, the differential reading circuit 512 includes one PMOS 752, one PMOS 753, a wiring 757 connected to a connection point 756, a wiring 759 connected to a connection point 758, and an amplifier 760 having two input terminals to which the two wirings 757 and 759 are connected. The amplifier 760 is a differential amplifier.

In the differential reading circuit 512, a current $I_{data}$ flowing through the third bit line BL3 is a current corresponding to a value of data stored in the selected magnetoresistance effect element (one of the three second magnetoresistance effect elements MTJ2, MTJ4, and MTJ6), a voltage $V_{data}$ of the connection point 756 is a voltage corresponding to the value of the data, and a voltage $V_{ref}$ of the connection point 758 is a voltage corresponding to the reference current $I_{ref}$. Accordingly, a voltage corresponding to the value of the data is output from an output terminal 761 of the amplifier 760.

In addition, the reference unit 770 includes a resistance part 773 connected to a predetermined voltage and an NMOS 772 connected between the resistance part 773 and a reference branching point (a connection point between the two wirings 748 and 749).

In addition, an output terminal of an OR circuit 771 is connected to a gate (g) of the NMOS 772. In this example, voltages applied to three word lines WL1 to WL3 are respectively applied to three input terminals of the OR circuit 771.

In a case in which a high voltage is applied to at least one of the three word lines WL1 to WL3, the OR circuit 771 sets the gate (g) of the NMOS 772 as being high, thereby permitting a reference current $I_{ref}$ to flow to the reference branching point (the connection point between the two wirings 748 and 749). On the other hand, in a case in which a low voltage is applied to all the three word lines WL1 to WL3, the OR circuit 771 sets the gate (g) of the NMOS 772 as being low, thereby preventing the reference current $I_{ref}$ from flowing to the reference branching point (the connection point between the two wirings 748 and 749).

As voltages applied to the OR circuit 771, for example, voltages may branch from the word lines WL1 to WL3, or the same voltages as voltages applied to the word lines WL1 to WL3 by the row decoder 131 may be applied.

<Configuration Including Four or More Unit Magnetic Memories>

Here, a configuration including four or more unit magnetic memories will be illustrated.

Figure 10:
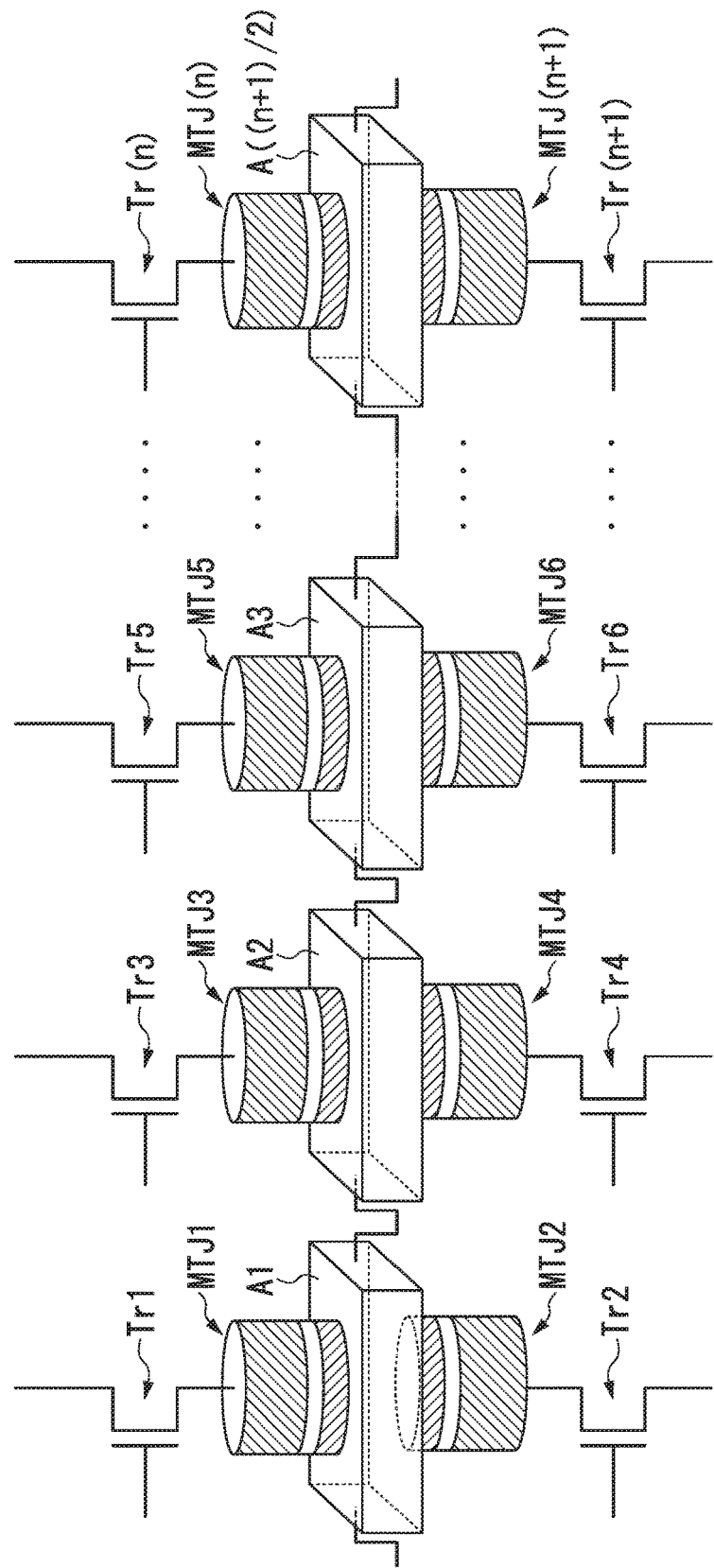
FIG. 10 is a diagram illustrating a configuration including four or more unit magnetic memories according to an embodiment of the present disclosure.

FIG. 10 is a diagram illustrating a configuration including four or more unit magnetic memories according to an embodiment of the present disclosure.

In the example illustrated in FIG. 10, an image in which spin-orbit torque wirings A1 to A((n+1)/2) present in each unit magnetic memory are connected in series is illustrated. In the example illustrated in FIG. 10, {(n+1)/2} unit magnetic memories, in which n is an odd number of "7" or more, are included in series.

<Voltage Signal in Both-Side Independent-Type Magnetic Memory>

Figure 11:
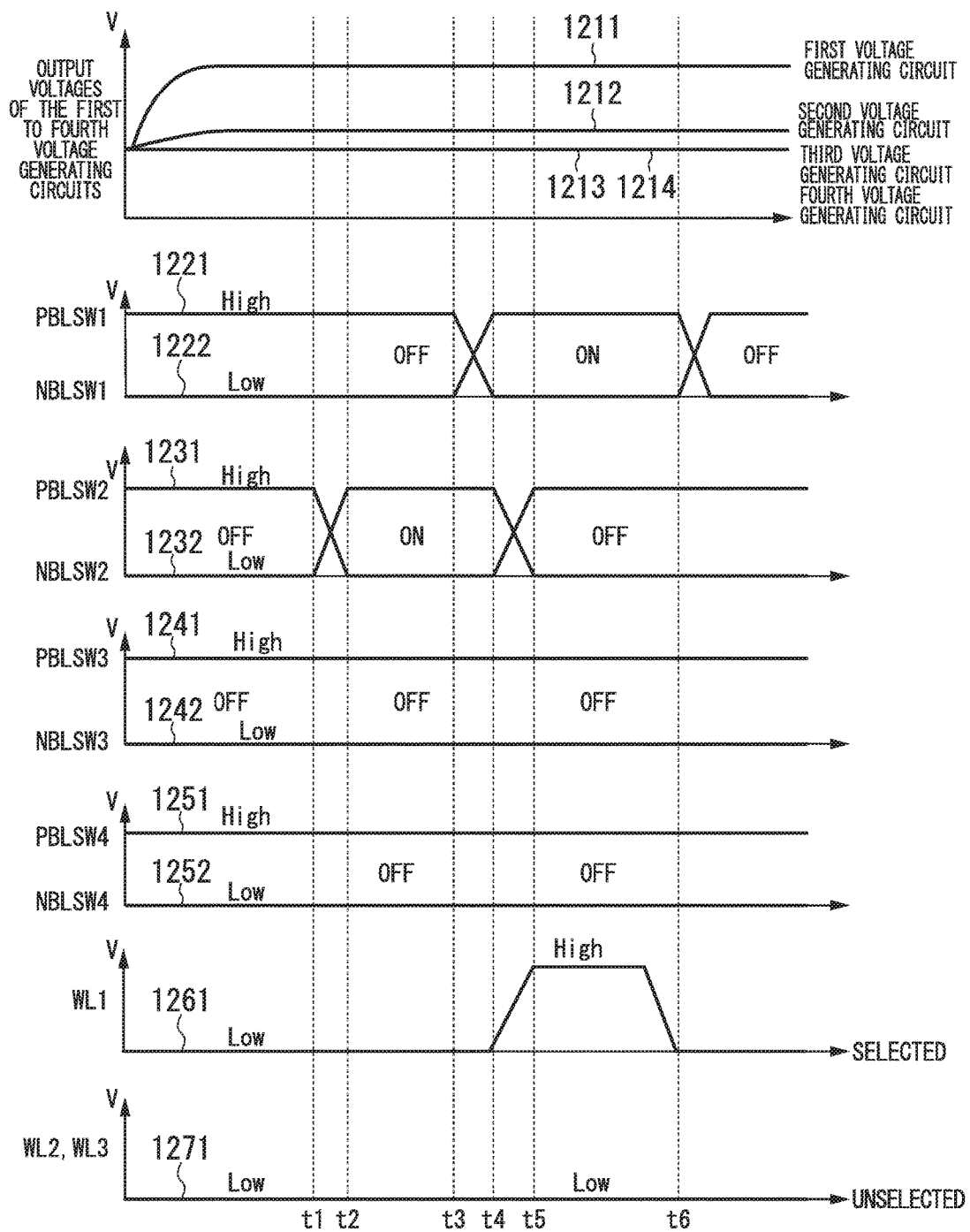
FIG. 11 is a diagram illustrating an example of a voltage of each unit in a both-side independent type magnetic memory according to an embodiment of the present disclosure.

FIG. 11 is a diagram illustrating an example of a voltage of each unit in the both-side independent type magnetic memory M2 according to an embodiment of the present disclosure.

FIG. 11 illustrates voltages 1211 to 1214 respectively output from four voltage generating circuits 151 to 154, voltages of a first switching circuit SW1 that are inverted from each other (a voltage 1221 of PBLSW1 and a voltage 1222 of NBLSW1), voltages of a second switching circuit SW2 that are inverted from each other (a voltage 1231 of PBLSW2 and a voltage 1232 of NBLSW2), voltages of a third switching circuit SW3 that are inverted from each other (a voltage 1241 of PBLSW3 and a voltage 1242 of NBLSW3), voltages of a fourth switching circuit SW4 that are inverted from each other (a voltage 1251 of PBLSW4 and a voltage 1252 of NBLSW4), a voltage 1261 applied to a first word line WL1, and a voltage 1271 applied to a second word line WL2 and a third word line WL3.

Here, PBLSW1 to PBLSW4 respectively represent voltages applied to gate (g) terminals of PMOSs of the switching circuits SW1 to SW4. In addition, NBLSW1 to NBLSW4 respectively represent voltages applied to gate (g) terminals of NMOSs of the switching circuits SW1 to SW4.

In each thereof, the vertical axis represents the voltage, and the horizontal axis represents a time interval (time).

In this example, the voltages inverted from each other are a high voltage that is a constant voltage of the high side and a low voltage that is a constant voltage of the low side.

In this example, the voltage 1213 applied by the third voltage generating circuit 153 and the voltage 1214 applied by the fourth voltage generating circuit 154 are the same as being 0 [V]. In addition, in this example, the voltage applied to the second word line WL2 and the voltage applied to the third word line WL3 are the same voltage (the voltage 1271).

In this example, for the convenience of description, times t1 to t6 aligned in the order of a time series are illustrated.

The voltage 1211 of the first voltage generating circuit 151 and the voltage 1214 of the fourth voltage generating circuit 154 have a difference. In this example, the voltage 1211 of the first voltage generating circuit 151 is higher than the voltage 1214 of the fourth voltage generating circuit 154.

The voltage 1212 of the second voltage generating circuit 152 and the voltage 1213 of the third voltage generating circuit 153 have a difference. In this example, the voltage 1212 of the second voltage generating circuit 152 is higher than the voltage 1213 of the third voltage generating circuit 153.

In this example, a difference (absolute value) between the voltage 1211 of the first voltage generating circuit 151 and the voltage 1214 of the fourth voltage generating circuit 154 is larger than a difference (absolute value) between the voltage 1212 of the second voltage generating circuit 152 and the voltage 1213 of the third voltage generating circuit 153.

Here, in this embodiment, as a state of each of the switching circuits SW1 to SW4, an on-state represents a state in which both ends of each of the switching circuits SW1 to SW4 is connected, and an off-state represents a state in which both ends of each of the switching circuits SW1 to SW4 are open (a state in which the both ends are not connected).

In addition, in this embodiment, as a voltage state of each of the word lines WL1 to WL3, a low-voltage state represents a state in which the word line is not selected, and a high-voltage state is a state in which the word line is selected.

The state of the first switching circuit SW1 is off up to the time t3, changes to on over the time t3 to the time t4, and changes to off from the time t6.

The state of the second switching circuit SW2 is off up to the time t1, changes to on over the time t1 to the time t2, and changes to off over the time t4 to the time t5.

The state of the third switching circuit SW3 is maintained as being the off state.

The state of the fourth switching circuit SW4 is maintained as being the off state.

A voltage state of the first word line WL1 is the low state up to the time t4, changes to high state over the time t4 to the time t5, and changes to the low state over before the time t6 to the time t6.

Both the voltage state of the second word line WL2 and the voltage state of the third word line WL3 are maintained as being the low state.

In the example illustrated in FIG. 11, in the first unit magnetic memory 11 corresponding to the first word line WL1, the first magnetoresistance effect element MTJ1 corresponding to the first bit line BL1 is selected for rewriting data.

In addition, in this example, an SOT current flowing in accordance with the second switching circuit SW2 and the third switching circuit SW3 flows first (in other words, early in time), and thereafter, an STT current flowing in accordance with the first switching circuit SW1 and the fourth switching circuit SW4 flows later (in other words, late in time).

In this example, a duration (time width) in which the STT current flows in accordance with the first switching circuit SW1 and the fourth switching circuit SW4 is longer than a duration (time width) in which the SOT current flows in accordance with the second switching circuit SW2 and the third switching circuit SW3.

In this example, a voltage applied for flowing the STT current is higher than a voltage applied for flowing the SOT current.

In this example, by applying a voltage between both ends of the spin-orbit torque wiring 111 (between the second switching circuit SW2 and the third switching circuit SW3), the influence of a current leaking to the spin-orbit torque wiring 111 is decreased.

Figure 12:
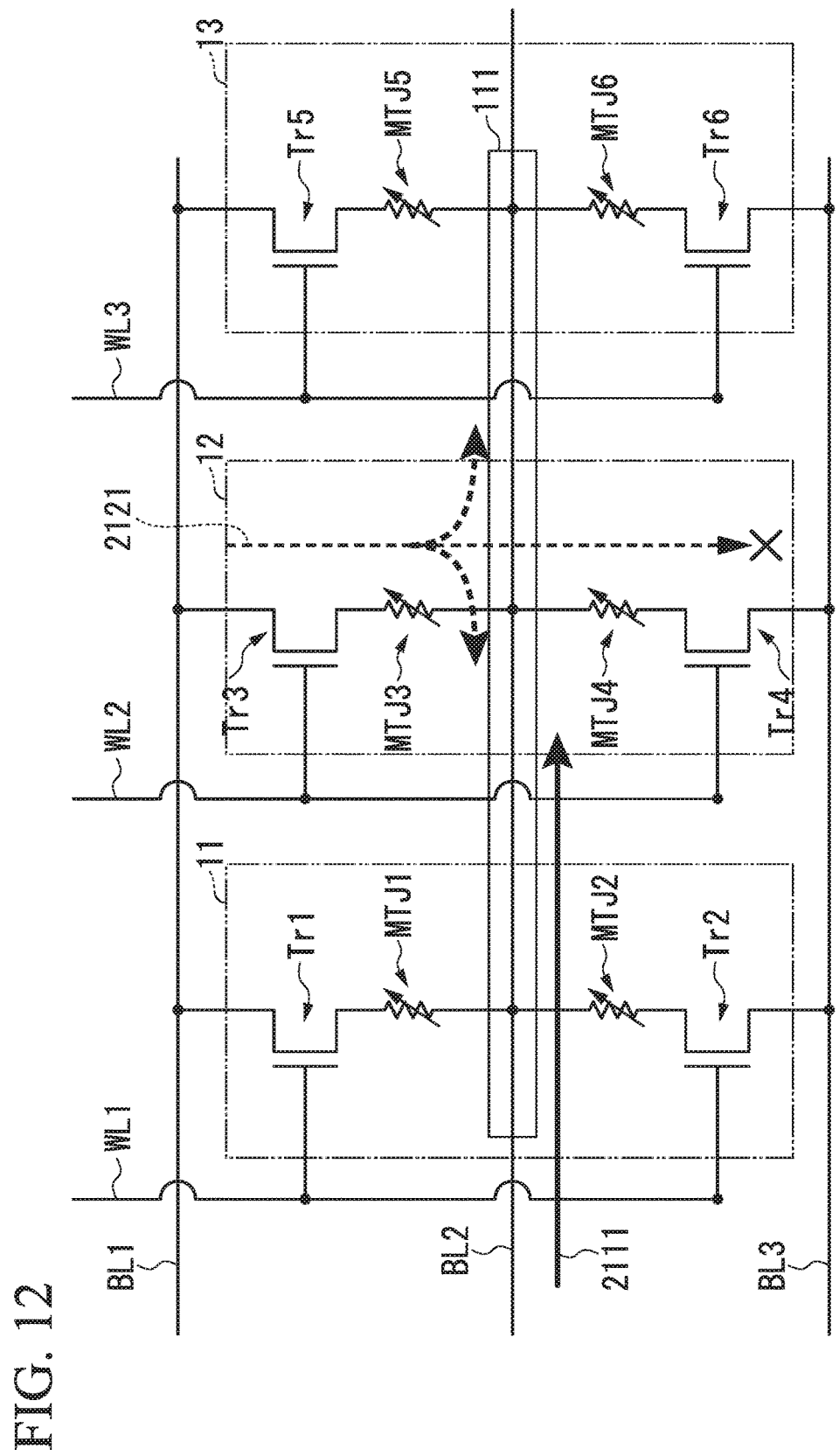
FIG. 12 is a diagram illustrating an example of a writing operation in a both-side independent type magnetic memory according to an embodiment of the present disclosure.

FIG. 12 is a diagram illustrating an example of a writing operation in a both-side independent-type magnetic memory M2 according to an embodiment of the present disclosure.

In the example illustrated in FIG. 12, a case in which a writing operation is performed for the first magnetoresistance effect element MTJ3 of the second unit magnetic memory 12 is illustrated. In this case, an SOT current 2111 flows through the spin-orbit torque wiring 111, and an STT current 2121 flows in the stacking direction of the first magnetoresistance effect element MTJ3 of the second unit magnetic memory 12, whereby a writing operation is performed.

In this example, a current does not flow in the stacking direction of the second magnetoresistance effect element MTJ4 of the second unit magnetic memory 12.

In the both-side independent-type magnetic memory M2 as illustrated in FIG. 9, in each of the unit magnetic memories 11 to 13, one of data "0" and data "1" can be stored using a magnetoresistance effect element of one side.

In the both-side independent-type magnetic memory M2 as illustrated in FIG. 9, in each of the unit magnetic memories 11 to 13, for example, one data among four values 00, 01, 10, and 11 can be stored by both-side magnetoresistance effect elements.

In addition, in the both-side independent-type magnetic memory M2 as illustrated in FIG. 9, a value of data written in each of the magnetoresistance effect elements MTJ1 to MTJ6 of each of the unit magnetic memories 11 to 13 can be read through one of the first bit line BL1 and the third bit line BL3.

In the both-side independent-type magnetic memory M2 as illustrated in FIG. 9, for example, by writing and reading data of one side, compared to the complementary magnetic memory M1 as illustrated in FIG. 5, a use requiring a high density can be responded.

[Example of Characteristic of Circuit]

Figure 13:
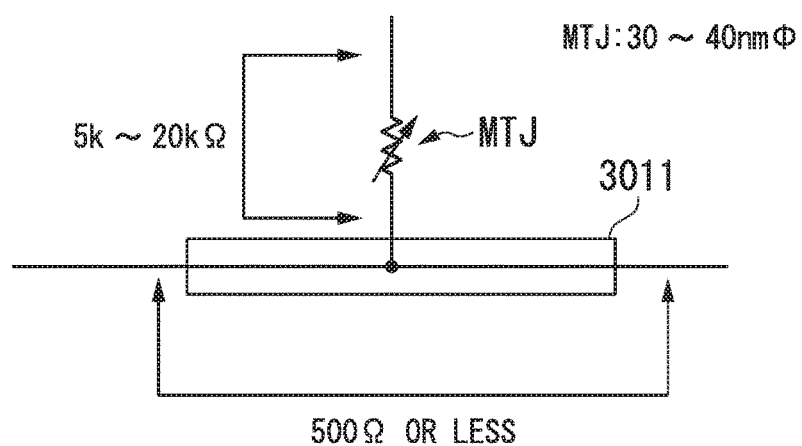
FIG. 13 is a diagram illustrating an example of a spin-orbit torque wiring and characteristics of a magnetoresistance effect element according to an embodiment of the present disclosure.

FIG. 13 is a diagram illustrating an example of a spin-orbit torque wiring 3011 and characteristics of a magnetoresistance effect element MTJ according to an embodiment of the present disclosure.

In the example illustrated in FIG. 13, although the first magnetoresistance effect element MTJ for the spin-orbit torque wiring 3011 is illustrated for description, it similarly applies also to the second magnetoresistance effect element.

For a part corresponding to one unit magnetic memory, the resistance value of the spin-orbit torque wiring 3011, for example, is 500 [Ω] or less. In addition, the resistance value of the magnetoresistance effect element MTJ, for example, is about 5 [kΩ] to 20 [kΩ]. In addition, a diameter of a face perpendicular to the stacking direction of the magnetoresistance effect element MTJ, for example, is 30 [nm] to 40 [nm].

Here, regarding the resistance value of the magnetoresistance effect element MTJ, Rp (a resistance value at the time of parallel magnetization) is about 5 [kΩ] to 10 [kΩ], and Rap (a resistance value at the time of antiparallel magnetization) is about 10 [kΩ] to 20 [kΩ].

Such values are examples, and the embodiment is not limited to such values.

Figure 14:
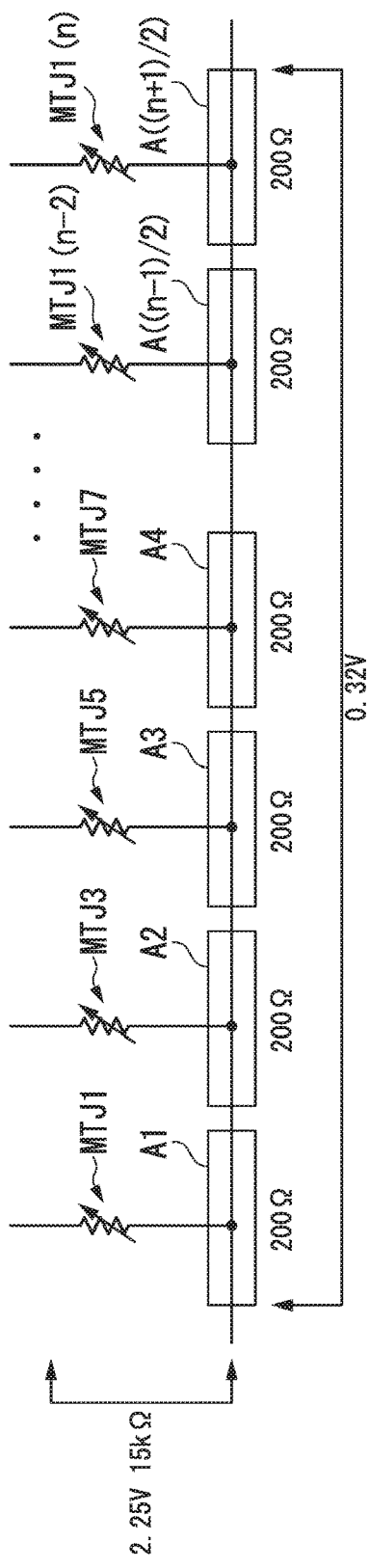
FIG. 14 is a diagram illustrating an example of characteristics of spin-orbit torque wirings and magnetoresistance effect elements according to an embodiment of the present disclosure.

FIG. 14 is a diagram illustrating an example of characteristics of spin-orbit torque wirings A1 to A((n+1)/2) and magnetoresistance effect elements MTJ1 to MTJ(n) according to an embodiment of the present disclosure.

In the example illustrated in FIG. 14, although the first magnetoresistance effect elements MTJ1 to MTJ(n) for the spin-orbit torque wirings A1 to A((n+1)/2) are illustrated and will be described for each unit magnetic memory, it similarly applies also to the second magnetoresistance effect elements.

In the example illustrated in FIG. 14, for the convenience of description, an image of the spin-orbit torque wirings A1 to A((n+1)/2) as illustrated in FIG. 10 is illustrated, and the same reference signs as those illustrated in FIG. 10 are assigned.

In the example illustrated in FIG. 14, the resistance value of each of the spin-orbit torque wirings A1 to A((n+1)/2) is 200 [Ω]. In addition, in this example, the resistance value of each of the first magnetoresistance effect elements MTJ1 to MTJ(n) is 15 [kΩ]. In this example, a case in which n=31 will be described as an example.

First, in a case in which a current of 150 [μA] is used as an STT current, a voltage applied to each of the first magnetoresistance effect elements MTJ1 to MTJ(n) is 2.25 [V] (=15 [kΩ]×150 [μA]).

In addition, in a case in which a current of 100 [μA] is used as an SOT current, a resistance value of the entire 16 spin-orbit torque wirings A1 to A((n+1)/2) is 3.2 [kΩ] (=200 [Ω]×16). Furthermore, a voltage applied to the entire 16 spin-orbit torque wirings A1 to A((n+1)/2) is 0.32 [V] (=3.2 [kΩ]×100 [μA]).

In addition, in a case in which 400 [Ω] is used as a resistance value of each of the spin-orbit torque wirings A1 to A((n+1)/2), a voltage applied to the entire 16 spin-orbit torque wirings A1 to A((n+1)/2) is 0.64 [V].

Figure 15:
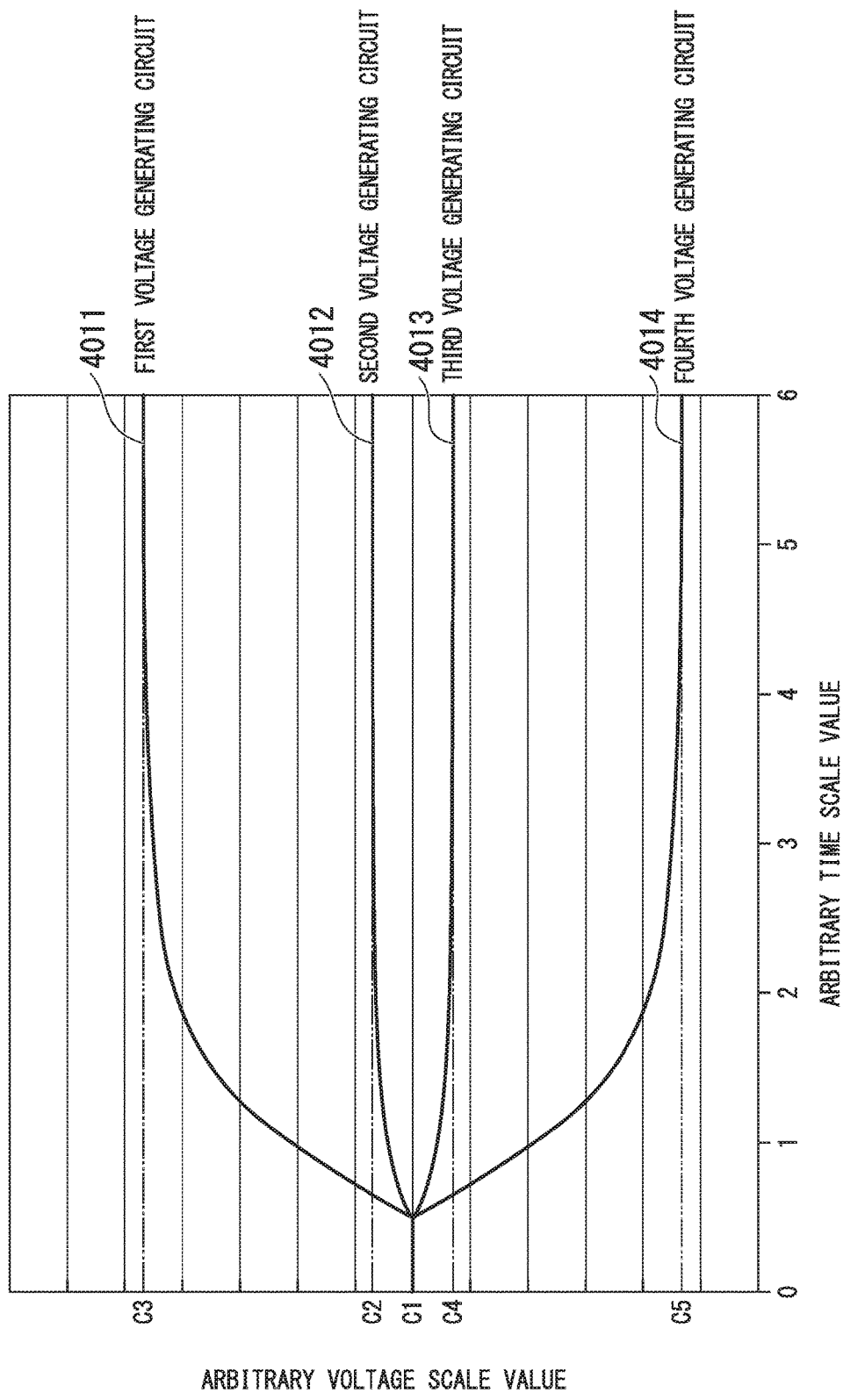
FIG. 15 is a diagram illustrating an example of characteristics of voltages of voltage generating circuits according to an embodiment of the present disclosure.

FIG. 15 is a diagram illustrating an example of characteristics of voltages of voltage generating circuits according to an embodiment of the present disclosure. In graphs illustrated in FIG. 15, the vertical axis represents the voltage, and the horizontal axis represents the time interval (time). In the example illustrated in FIG. 15, the voltage of the vertical axis is an arbitrarily-scaled value, and the time interval (time) of the horizontal axis is an arbitrarily-scaled value.

In the example illustrated in FIG. 15, a voltage 4011 generated by a first voltage generating circuit 151, a voltage 4012 generated by a second voltage generating circuit 152, a voltage 4013 generated by a third voltage generating circuit 153, a voltage 4014 generated by a fourth voltage generating circuit 154 are illustrated as timing diagrams.

The voltages of the four voltage generating circuits (the first voltage generating circuit 151, the second voltage generating circuit 152, the third voltage generating circuit 153, and the fourth voltage generating circuit 154) are initially the same as being a voltage C1. Thereafter, the voltage of each of the voltage generating circuits 151 to 154 changes and becomes constant (or almost constant) near a predetermined voltage.

More specifically, the voltage 4011 of the first voltage generating circuit 151 becomes constant near a voltage C3, the voltage 4012 of the second voltage generating circuit 152 becomes constant near a voltage C2, the voltage 4013 of the third voltage generating circuit 153 becomes constant near a voltage C4, and the voltage 4014 of the fourth voltage generating circuit 154 becomes constant near a voltage C5.

Here, as an example, the voltage C1=0 [V], the voltage C2=+0.25 [V], the voltage C3=+2.25 [V], the voltage C4=−0.25 [V], and the voltage C5=−2.25 [V]. As another example, it may be set such that the voltage C2=+0.4 [V], and the voltage C4=−0.4 [V].

[Application Tunings of SOT Current and STT Current]

The application timings of an SOT current (may be referred to as an "SOT inversion current") and an STT current (may be referred to as an "STT inversion current") for the magnetoresistance effect elements MTJ1 and MTJ2 as an example will be described with reference to FIGS. 16 to 18.

The timings at which the STT current and the SOT current are applied to the magnetoresistance effect elements MTJ1 and MTJ2 will be described. The timings, for example, are controlled by a control unit (not illustrated in the drawing).

Figure 16:
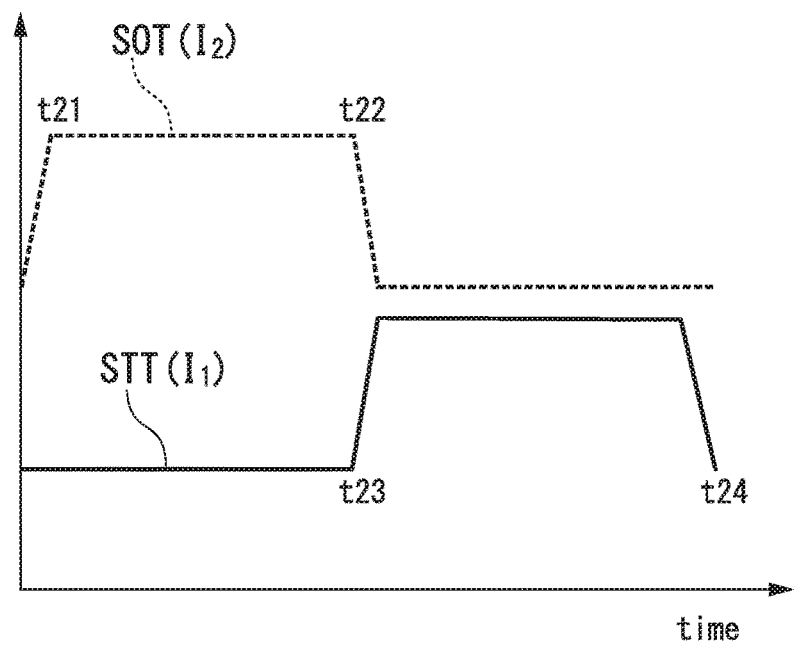
FIG. 16 is a diagram illustrating an example of application timings of an STT current and an SOT current according to an embodiment of the present disclosure.

FIG. 16 is a diagram illustrating an example of application timings of an STT current and an SOT current according to an embodiment of the present disclosure.

FIG. 16 illustrates an example of an output waveform of the STT current $STT(I_1)$ and an example of an output waveform of an SOT current $SOT(I_2)$. In graphs illustrated in FIG. 16, the horizontal axis represents the time interval (time), and times t21 to t24 are illustrated.

In this example, a time at which the application of the SOT current $SOT(I_2)$ is started is the time t21, a time at which the application of the SOT current $SOT(I_2)$ is stopped is the time t22, a time at which the application of the STT current $STT(I_1)$ is started is the time t23, and a time at which the application of the STT current $STT(I_1)$ is stopped is the time t24.

In this embodiment, the control unit applies the STT current $STT(I_1)$ to the magnetoresistance effect elements MTJ1 and MTJ2 at the same tuning as that of the SOT current $SOT(I_2)$ or a timing after that of the SOT current $SOT(I_2)$. In other words, the time t23 is simultaneously with the time t21 or after the time t21.

By applying the SOT current $SOT(I_2)$ and the STT current $STT(I_1)$ at such timings, a time required for the magnetization reversal of the magnetoresistance effect elements MTJ1 and MTJ2 can be shortened, and the writing speed of the magnetoresistance effect elements MTJ1 and MTJ2 increases.

The reason for this will be described.

As described also in S. Fukami, T. Anekawa, C. Zhang, and H. Ohno, Nature Nanotechnology, DOI:10.1038/NNANO. 2016. 29, a mechanism of magnetization reversal using the SOT effect and a mechanism of magnetization reversal using the STT effect are different from each other, and behaviors up to magnetization reversal is assumed to be different therebetween.

Figure 17:
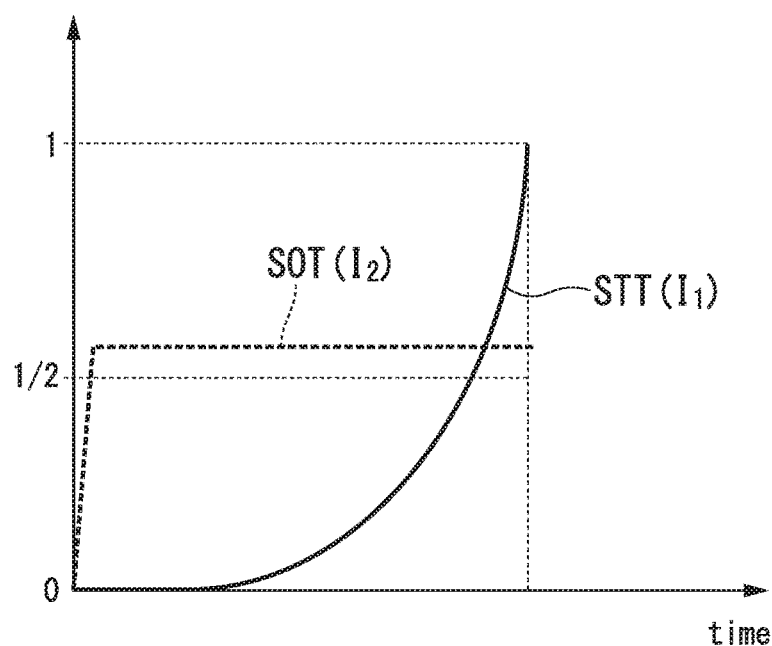
FIG. 17 is a diagram schematically illustrating behaviors of magnetization reversal using an STT effect and magnetization reversal using an SOT effect according to an embodiment of the present disclosure.

FIG. 17 is a diagram schematically illustrating behaviors of magnetization reversal using an STT effect and magnetization reversal using an SOT effect according to an embodiment of the present disclosure.

In graphs illustrated in FIG. 17, the vertical axis represents the direction of magnetization of free layer 51 and 71, and the horizontal axis represents a time interval (time). In the vertical axis, the direction of magnetization is reversed between "0" and "1".

FIG. 17 illustrates the STT current $STT(I_1)$ and the SOT current $SOT(I_2)$.

The STT effect promotes precession of magnetization of the free layers 51 and 71 and contributes to magnetization reversal. For this reason, unless a change for the precession of magnetization is not added in accordance with heat, fluctuation of an external magnetic field, or the like, it is difficult for magnetization reversal to occur even when the STT current $STT(I_1)$ is applied. In addition, until energy according to the precession becomes sufficiently large, the magnetization inside the free layers 51 and 71 is not reversed. For this reason, as illustrated in FIG. 17, there is a time difference before the STT effect affects the magnetization reversal after application of the STT current $STT(I_1)$.

On the other hand, the SOT effect provides a force for rotating the magnetization of the free layers 51 and 71 by 90°, and magnetization reversal occurs when the magnetization that has been excessively rotated becomes a stable arrangement. As also illustrated in FIGS. 1a and 1c of S. Fukami, T. Anekawa, C. Zhang, and H. Ohno, Nature Nanotechnology, DOI:10.1038/NNANO. 2016. 29, as magnetization, magnetization reversal occurs without going through precession of magnetization when the magnetization reversal is started. In other words, in a case in which the SOT effect is used, the going through the precession of magnetization is not necessary, and, as illustrated in FIG. 17, a time difference before there is an influence of the SOT effect on magnetization reversal after the application of the SOT current $SOT(I_2)$ is short.

Since the STT effect goes through a process of accumulating energy according to the precession of magnetization, a time until the magnetization reversal occurs is necessary, and the stability of the magnetization reversal is high by giving sufficient energy. On the other hand, the SOT effect uses natural mitigation after giving a force of rotating magnetization by 90°, and accordingly, although the stability of the magnetization reversal is degraded more than that of a case in which the STT effect is used, a time until magnetization reversal occurs can be shortened more than in a case in which the STT effect is used. Here, the stability of magnetization reversal represents an increase in the probability of magnetization reversal and represents an increase in the ratio of magnetization that has been reversed to a plurality of magnetizations.

Thus, by applying the STT current $STT(I_1)$ to the magnetoresistance effect elements MTJ1 and MTJ2 at a timing after the application of the SOT current $SOT(I_2)$ (the time t23 after the time t21), the STT effect can be used after the use of the SOT effect. Accordingly, a time required for magnetization reversal can be decreased, and the stability of the magnetization reversal can be increased.

In addition, in a case in which the SOT current $SOT(I_2)$ and the STT current $STT(I_1)$ are simultaneously applied to the magnetoresistance effect elements MTJ1 and MTJ2 (in a case in which the time t21=the time t23), a change for the precession of magnetization can be decreased by the SOT effect, and a time required for magnetization reversal can be decreased.

Here, in a case in which the direction of magnetization of the free layers 51 and 71 and the direction of spins supplied from the spin-orbit torque wiring 31 to the free layer 71 are parallel or antiparallel to each other, it is preferable to simultaneously apply the SOT current $SOT(I_2)$ and the STT current $STT(I_1)$.

In a case in which the direction of magnetization of the free layers 51 and 71 and the direction of spins supplied to the free layers 51 and 71 are parallel or antiparallel to each other, a relative angle between the magnetization of the free layers 51 and 71 and the supplied spins is zero, and it is difficult to give a torque to the magnetization of the free layers 51 and 71. For this reason, in order to induce magnetization reversal, it is necessary to generate precession of magnetization using fluctuation of the relative angle between the magnetization and the supplied spins (for example, see FIG. 1b of S. Fukami, T. Anekawa, C. Zhang, and H. Ohno, Nature Nanotechnology, DOI:10.1038/NNANO. 2016. 29).

In a case in which the SOT current $SOT(I_2)$ and the STT current $STT(I_1)$ are simultaneously applied, a change for applying a torque to magnetization is given using the SOT effect, and the STT effect can be superimposed thereon before the chance disappears. In other words, by increasing the contribution of the STT effect from an initial stage when magnetization reversal occurs, the precession of magnetization can be promoted.

On the other hand, in a case in which the direction of magnetization of the free layers 51 and 71 and the direction of spins supplied from the spin-orbit torque wiring 31 to the free layers 51 and 71 intersect each other, it is preferable to apply the STT current $STT(I_1)$ after the SOT current SOT $(I_2)$ is applied.

In a case in which the direction of magnetization of the free layers 51 and 71 and the direction of spins supplied to the free layers 51 and 71 intersect each other, it is easier to give a torque to magnetization than in a case in which the directions are parallel or antiparallel to each other. For this reason, a torque for inducing magnetization reversal in the magnetization can be given from immediately after a current is applied (for example, see FIGS. 1a and 1c of S. Fukami, T. Anekawa, C. Zhang, and H. Ohno, Nature Nanotechnology, DOI:10.1038/NNANO. 2016. 29). As illustrated in FIG. 17, the SOT current $SOT(I_2)$ can have an effect on the magnetization more quickly than the STT current $STT(I_1)$, and thus, by increasing the contribution ratio using the SOT effect for the magnetization reversal in an initial period, the magnetization reversal can be promoted more quickly.

In addition, in this embodiment, it is preferable that the control unit stops the application of the STT current $STT(I_1)$ to the magnetoresistance effect elements MTJ1 and MTJ2 at a timing after the SOT current $SOT(I_2)$ (the time t24 is after the time t22).

While the SOT effect gives a force for rotating the magnetization by 90°, a torque given to the magnetization becomes weak near the rotation of the magnetization by 90°. For this reason, even when the application of only the SOT current $SOT(I_2)$ is continued, there are cases in which magnetization toward unstable orientation (for example, near ½ in the vertical axis in FIG. 17) is influenced by heat or the like and is oriented in an opposite direction of a direction that is originally assumed. On the other hand, when the STT current $STT(I_1)$ is applied to the end, energy that is sufficient for inducing magnetization reversal can be given, and the magnetization reversal can be induced more assuredly.

In a case in which times until the applications of the SOT current $SOT(I_2)$ and the STT current $STT(I_1)$ are stopped after the SOT current $SOT(I_2)$ is applied are sufficiently long, the order in which the application of the SOT current $SOT(I_2)$ and the application of the STT current $STT(I_1)$ are stopped is not particularly limited. However, from the viewpoint of long-life, high-speed driving, and the like of the magnetoresistance effect elements MTJ1 and MTJ2, it is preferable that a time in which the current is applied is short. For example, it is preferable that a time until the applications of the SOT current $SOT(I_2)$ and the STT current $STT(I_1)$ are stopped after the application of the SOT current $SOT(I_2)$ is 10 nsec or less.

As described above, when the application of the STT current $STT(I_1)$ to the magnetoresistance effect elements MTJ1 and MTJ2 is stopped after the SOT current SOT $(I_2)$, even in a case in which the application times of the SOT current $SOT(I_2)$ and the STT current $STT(I_1)$ are short, the magnetization reversal can be performed more assuredly.

In addition, it is preferable that the control unit performs control such that the application of the SOT current $SOT(I_2)$ is stopped after the application of the STT current $STT(I_1)$ to the magnetoresistance effect elements MTJ1 and MTJ2 or simultaneously with the application (the time t22 is after or the same as the time t23).

The SOT effect does not disappear simultaneously with the stopping of the application of the SOT current $SOT(I_2)$. In other words, there is a time difference until the SOT effect disappears after the stopping of the application of the SOT current $SOT(I_2)$.

One of the reasons for this is that there is a limited life of a spin current generated in accordance with the SOT effect. A spin current generated in a substance decreases to half in a time of a spin life. It is known that a spin life is about 10 [ps] to 100 [ps] in the case of a general metal such as Al, Cu, or Ag, and a spin life is about 1 [ns] to 1 [ms] in the case of a semiconductor such as Si or an organic material.

Another reason is a time until spins rotated in accordance with the SOT effect are settled down to a stable state. For example, generally, a time required for spins inclined from an axis of easy magnetization by about 90 degrees in accordance with the SOT effect to return to the original direction of the axis of easy magnetization is about 100 [ps] to 1 [ns].

For this reason, in a case in which the application of the SOT current SOT $(I_2)$ is stopped after or simultaneously with application of the STT current $STT(I_1)$, a timing at which the SOT effect and the STT effect are superimposed in the process of application of currents for magnetization reversal reliably occurs.

In other words, in a case in which a time interval from a timing at which the application of the SOT current $SOT(I_2)$ is stopped to a timing at which the STT current $STT(I_1)$ is applied is at least within 100 [ps], the SOT effect reliably remains. For example, a time in which the SOT effect remains may be different in accordance with a material of the spin-orbit torque wiring 31.

For example, in a case in which the material of the spin-orbit torque wiring 31 is a metal, a time interval from a tuning at which the application of the SOT current $SOT(I_2)$ is stopped to a timing at which the STT current $STT(I_1)$ is applied is within 100 [ps]. In addition, for example, in a case in which the material of the spin-orbit torque wiring 31 is a semiconductor, a time interval from a timing at which the application of the SOT current $SOT(I_2)$ is stopped to a timing at which the STT current $STT(I_1)$ is applied is within 1 [ns].

Figure 18:
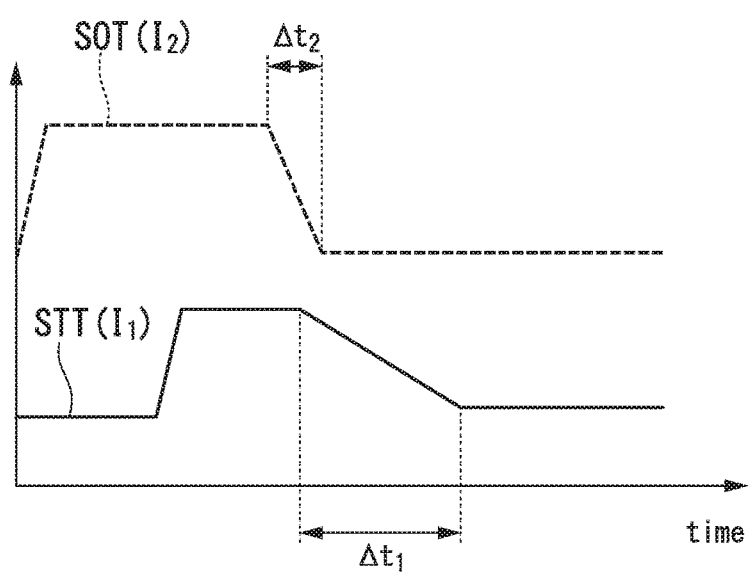
FIG. 18 is a diagram illustrating an example of timings of applications and cut-off of an STT current and an SOT current according to an embodiment of the present disclosure.

FIG. 18 is a diagram illustrating an example of timings of applications and cut-off of an STT current $STT(I_1)$ and an SOT current $SOT(I_2)$ according to an embodiment of the present disclosure.

As illustrated in FIG. 18, it is preferable that a tail time Δt2 until the applied SOT current $SOT(I_2)$ becomes zero is shorter than a tail time Δt1 until the applied STT current $STT(I_1)$ becomes zero.

As illustrated in FIG. 17, the SOT current $SOT(I_2)$ gives a force for rotating the magnetization by 90°. In other words, continuation of the application of the SOT current $SOT(I_2)$ may be regarded as applying a force for maintaining the 90°-rotated state for the continuation of magnetization. Meanwhile, the magnetoresistance effect elements MTJ1 and MTJ2 are for the purpose of reversing the magnetization. For this reason, it is preferable to quickly remove a force for maintaining the 90°-rotated state by shortening the tail time Δt2.

On the other hand, as illustrated in FIG. 17, the STT current STT($I_1$) applies a force for reversing the magnetization. For this reason, by lengthening the tail time Δt1, it can be suppressed that the magnetization is probabilistically oriented in a direction different from an assumed direction by receiving the influence of external factors such as heat and the like.

As described above, by controlling the application timings of the STT current STT($I_1$) and the SOT current SOT($I_2$) applied to the magnetoresistance effect elements MTJ1 and MTJ2 using the control unit, a time required for the magnetization reversal of the free layers 51 and 71 can be shortened, and the stability of the magnetization reversal can be improved by increasing a probability of inducing the magnetization reversal. In other words, the writing speed of the magnetoresistance effect elements MTJ1 and MTJ2 can be increased.

In addition, in the magnetoresistance effect elements MTJ1 and MTJ2 according to this embodiment can freely control the contribution ratio between the STT and the SOT using the amounts of currents supplied from power supplies. For this reason, the magnetoresistance effect elements MTJ1 and MTJ2 according to this embodiment can freely control the contribution ratio between the STT and the SOT in accordance with a performance required for a device and can function as magnetoresistance effect elements having higher versatility.

In addition, by controlling the amount of a current flowing in the stacking direction of the magnetoresistance effect elements MTJ1 and MTJ2 and the amount of a current flowing in a direction orthogonal to the stacking direction using power supplies thereof, a contribution ratio of the SOT and the STT contributing to the magnetization reversal can be freely controlled.

For example, in a case in which a large current cannot flow through a device, it can be controlled such that the STT having high energy efficiency for the magnetization reversal mainly operates. In other words, the amount of the current flowing from a power supply for the STT can be increased, and the amount of a current flowing from a power supply for the SOT can be decreased.

For example, in a case in which it is necessary to produce a thin device, and the thickness of the nonmagnetic layers 52 and 72 are formed thin, a current flowing through the nonmagnetic layers 52 and 72 is required to be low. In such a case, the contribution ratio of the SOT can be increased by decreasing the amount of a current flowing from the power supply for the STT and increasing the amount of a current flowing from the power supply for the SOT.

<Magnetization Reversing Technique>

A magnetization reversing technique according to this embodiment, for example, is configured for a current density flowing through the spin-orbit torque wiring 31 to be less than $1 \times 10^7$ A/cm² in the magnetoresistance effect elements MTJ1 and MTJ2 described above.

When the current density of the current flowing through the spin-orbit torque wiring 31 is too large, heat is generated in accordance with the current flowing through the spin-orbit torque wiring 31. When heat participates in the free layers 51 and 71, the stability of the magnetization of the free layers 51 and 71 disappears, and there are cases in which unexpected magnetization reversal or the like occurs. When such unexpected magnetization reversal occurs, there is a problem in that recorded information (a value of written data) is rewritten. In other words, in order to avoid unexpected magnetization reversal, it is preferable that the current density of the current flowing through the spin-orbit torque wiring 31 is not set to be too large. For example, by configuring the current density of the current flowing through the spin-orbit torque wiring 31 to be less than $1 \times 10^7$ A/cm², it is assumed that the occurrence of magnetization reversal due to at least generated heat can be avoided.

[Unit Magnetic Memory According to Another Configuration Example (Modified Example)]

Each of the unit magnetic memories 11 to 13 according to this embodiment may have a different configuration. The configuration of the unit magnetic memory according to another configuration example (modified example) will be described with reference to FIGS. 19 and 20.

<First Modified Example>

Figure 19:
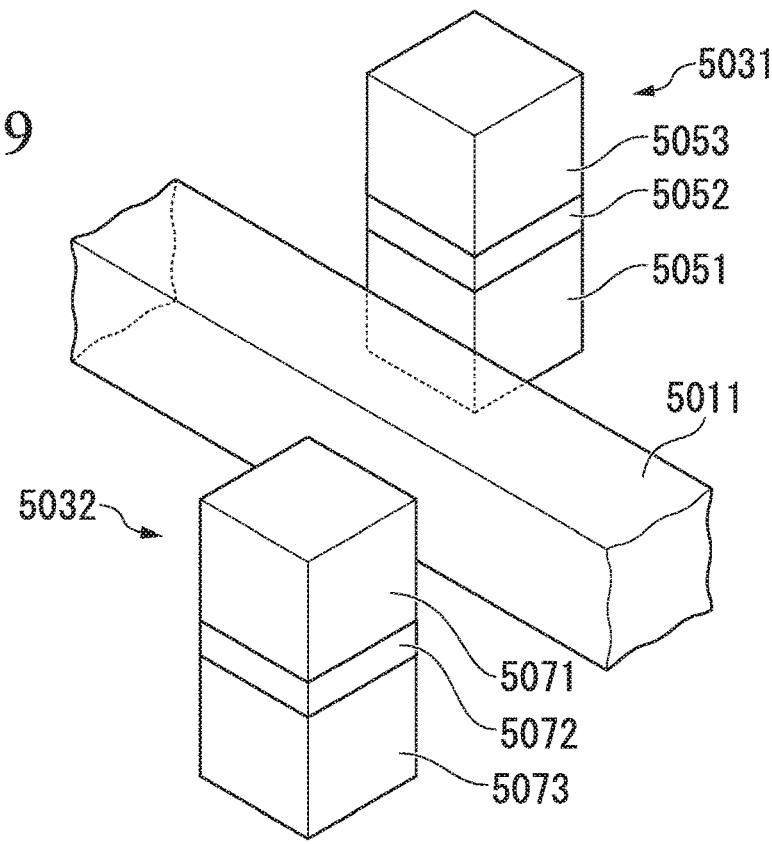
FIG. 19 is a diagram illustrating the configuration of a magnetic memory (unit magnetic memory) of a unit cell of a different example according to an embodiment of the present disclosure.

FIG. 19 is a diagram illustrating the configuration of a magnetic memory (unit magnetic memory) of a unit cell of a different example according to an embodiment of the present disclosure.

Here, FIG. 19 illustrates the configuration of a part of a spin-orbit torque wiring 5011 and two magnetoresistance effect elements (a first magnetoresistance effect element 5031 and a second magnetoresistance effect element 5032) included in a unit magnetic memory, and the other parts are similar to those of the configuration illustrated in FIG. 1.

The first magnetoresistance effect element 5031 has a configuration in which a free layer 5051, a nonmagnetic layer 5052, and a fixed layer 5053 are stacked. In the example illustrated in FIG. 19, an image of layers having a rectangle shape when viewed from the stacking direction as such layers (the free layer 5051, the nonmagnetic layer 5052, and the fixed layer 5053) is illustrated. In addition, as a shape of such layers, various shapes may be used.

Similarly, the second magnetoresistance effect element 5032 has a configuration in which a free layer 5071, a nonmagnetic layer 5072, and a fixed layer 5073 are stacked. In the example illustrated in FIG. 19, an image of layers having a rectangle shape when viewed from the stacking direction as such layers (the free layer 5071, the nonmagnetic layer 5072, and the fixed layer 5073) is illustrated. In addition, as a shape of such layers, various shapes may be used.

In the example illustrated in FIG. 19, a side face of the free layer 5051 of the first magnetoresistance effect element 5031 and a side face of the free layer 5071 of the second magnetoresistance effect element 5032 are brought into contact with (bonded to) two faces of the spin-orbit torque wiring 5011, which has a cube shape, facing each other. Here, in this example, the side faces of the free layers 5051 and 5071 represent faces parallel to the stacking direction of the free layers 5051 and 5071, the nonmagnetic layers 5052 and 5072, and the fixed layers 5053 and 5073. In addition, the "side face" may be referred to as another name. The two faces of the spin-orbit torque wiring 5011 facing each other, for example, may be faces of a small-width side or faces of a large-width side among faces included in the cube.

In addition, in the example illustrated in FIG. 19, in the magnetoresistance effect elements (the first magnetoresistance effect element 5031 and the second magnetoresistance effect element 5032), the stacking directions of the free layers 5051 and 5071, the nonmagnetic layers 5052 and 5072, and the fixed layers 5053 and 5073 are perpendicular to the extending direction of the spin-orbit torque wiring 5011 (for example, a direction in which a plurality of unit magnetic memories may be connected in series). In addition, stacking directions from the free layers 5051 and 5071 to the fixed layers 5053 and 5073 are opposite to each other (in other words, 180°-reversed) in the first magnetoresistance effect element 5031 and the second magnetoresistance effect element 5032.

<Second Modified Example>

Figure 20:
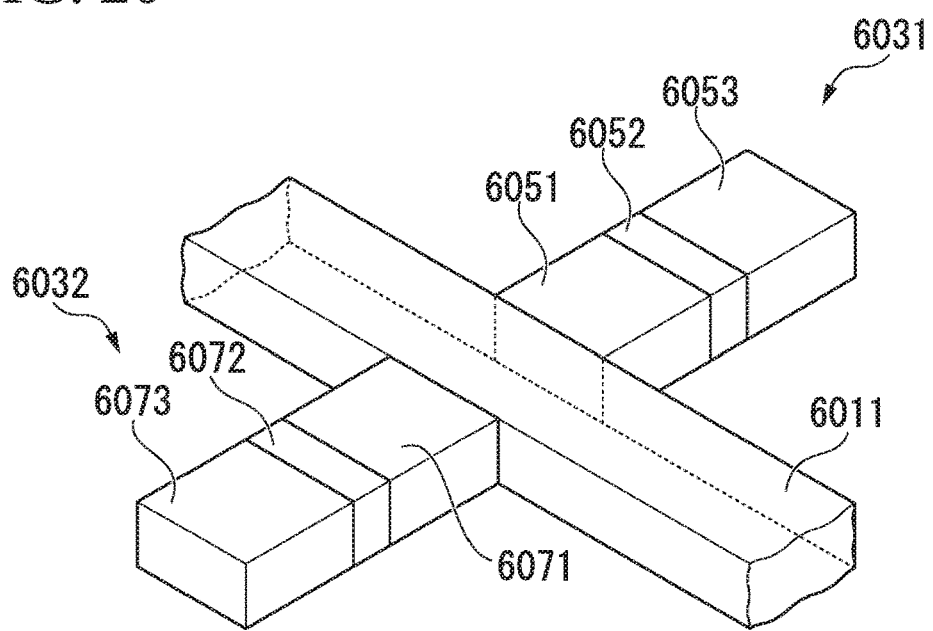
FIG. 20 is a diagram illustrating the configuration of a magnetic memory (unit magnetic memory) of a unit cell of a different example according to an embodiment of the present disclosure.

FIG. 20 is a diagram illustrating the configuration of a magnetic memory (unit magnetic memory) of a unit cell of a different example according to an embodiment of the present disclosure.

Here, FIG. 20 illustrates the configuration of a part of a spin-orbit torque wiring 6011 and two magnetoresistance effect elements (a first magnetoresistance effect element 6031 and a second magnetoresistance effect element 6032) included in a unit magnetic memory, and the other parts are similar to those of the configuration illustrated in FIG. 1.

The first magnetoresistance effect element 6031 has a configuration in which a free layer 6051, a nonmagnetic layer 6052, and a fixed layer 6053 are stacked. In the example illustrated in FIG. 20, an image of layers having a rectangle shape when viewed from the stacking direction as such layers (the free layer 6051, the nonmagnetic layer 6052, and the fixed layer 6053) is illustrated. In addition, as a shape of such layers, various shapes may be used.

Similarly, the second magnetoresistance effect element 6032 has a configuration in which a free layer 6071, a nonmagnetic layer 6072, and a fixed layer 6073 are stacked. In the example illustrated in FIG. 20, an image of layers having a rectangle shape when viewed from the stacking direction as such layers (the free layer 6071, the nonmagnetic layer 6072, and the fixed layer 6073) is illustrated. In addition, as a shape of such layers, various shapes may be used.

In the example illustrated in FIG. 20, a face of the free layer 6051 of the first magnetoresistance effect element 6031 and a face of the free layer 6071 of the second magnetoresistance effect element 6032 are brought into contact with (bonded to) two faces of the spin-orbit torque wiring 6011, which has a cube shape, facing each other. Here, the faces of the free layers 6051 and 6071 represent faces (faces not bonded to other layers) perpendicular to the stacking direction of the free layers 6051 and 6071, the nonmagnetic layers 6052 and 6072, and the fixed layers 6053 and 6073. The two faces of the spin-orbit torque wiring 6011 facing each other, for example, may be faces of a small-width side among faces included in the cube.

In addition, in the example illustrated in FIG. 20, in the magnetoresistance effect elements (the first magnetoresistance effect element 6031 and the second magnetoresistance effect element 6032), the stacking directions of the free layers 6051 and 6071, the nonmagnetic layers 6052 and 6072, and the fixed layers 6053 and 6073 are perpendicular to the extending direction of the spin-orbit torque wiring 6011 (for example, a direction in which a plurality of unit magnetic memories may be connected in series). In addition, stacking directions from the free layers 6051 and 6071 to the fixed layers 6053 and 6073 are opposite to each other (in other words, 180°-reversed) in the first magnetoresistance effect element 6031 and the second magnetoresistance effect element 6032.

[Summary of Embodiment Described Above]

As described above, in the unit magnetic memory 11 according to this embodiment, by vertically disposing a total of two circuits each configured of one magnetoresistance effect element, one transistor (one magnetoresistance effect element MTJ1 and one transistor Tr1 or one magnetoresistance effect element MTJ2 and one transistor Tr2) between three bit lines BL1 to BL3 running parallel to each other, both a writing operation of complementary data and a writing operation of one-side data can be realized.

In addition, since the unit magnetic memory 11 according to this embodiment has a function for a current to flow in the vertical direction through a heavy metal, an allowed value (margin) is increased when a writing operation or a reading operation is performed, whereby a leakage current can be decreased.

For example, an operation of extracting an STT current from immediately below the magnetoresistance effect elements MTJ1 and MTJ2 has a positive effect on a margin and a leakage current. In addition, in the unit magnetic memory 11 according to this embodiment, by vertically (or horizontally or the like) disposing the magnetoresistance effect elements MTJ1 and MTJ2 and the transistors Tr1 and Tr2 in the spin-orbit torque wiring 31 (second bit line BL2), for example, a writing operation and a reading operation of complementary data can be realized, and a high-speed memory having a large margin can be realized.

In this way, according to the unit magnetic memory 11 of this embodiment, at least one of a small leakage current, a large margin, and a high speed can be achieved.

<Example of Effect>

In the unit magnetic memory 11 and the magnetic memory M according to this embodiment, by inducing a spin orbit torque in a writing operation, magnetization reversal can be induced using both the spin orbit torque (SOT) and the spin transfer torque (STT). In such a configuration, for example, compared to a case in which magnetization reversal is induced using only the spin transfer torque (STT), the speed of the magnetization reversal can be improved, a leakage current can be decreased, and long-life of the magnetoresistance effect elements MTJ1 and MTJ2 can be achieved.

Here, in the unit magnetic memory 11 and the magnetic memory M according to this embodiment, in a writing operation, the spin orbit torque (SOT) is induced, and polarized electrons having an up-spin and a down-spin appear in one face (for example, an upper face or the like) and the other face (for example, a lower face or the like) of the spin-orbit torque wiring 31 (the second bit line BL2).

In the unit magnetic memory 11 and the magnetic memory M according to this embodiment, although the resistance of the second bit line BL2 appears as a redundancy corresponding to a deviation between a connection point (connection face) of one face (for example, an upper face or the like) of the spin-orbit torque wiring 31 (second bit line BL2) and a connection point (connection face) of the other face (for example, a lower face or the like) in a writing operation, by approaching such connection points (connection faces), the resistance thereof can be decreased.

In the unit magnetic memory 11 and the magnetic memory M according to this embodiment, a current I and a voltage V for writing data using the spin transfer torque (STT) can be supplied to the magnetoresistance effect elements MTJ1 and MTJ2 with a small unbalance.

In the unit magnetic memory 11 and the magnetic memory M according to this embodiment, a plurality of the voltage generating circuits 151 to 154 are included, and complementary wiring using a spin injection current can be performed for the two magnetoresistance effect elements MTJ1 and MTJ2 in a writing operation.

In addition, in the unit magnetic memory 11 and the magnetic memory M according to this embodiment, by configuring a differential pair using the two magnetoresistance effect elements MTJ1 and MTJ2, differential sensing can be realized in a reading operation.

In this way, in the unit magnetic memory 11 and the magnetic memory M according to this embodiment, by using the differential pair, a high speed, high sensitivity, and a high margin can be realized in a writing operation and a reading operation.

In addition, in the unit magnetic memory 11 and the magnetic memory M according to this embodiment, an unbalance of differential sensing can be decreased in a reading operation, and accordingly, a reading margin can be improved.

Furthermore, in the unit magnetic memory 11 and the magnetic memory M according to this embodiment, different data can be written in the first magnetoresistance effect elements MTJ1 and the second magnetoresistance effect element MTJ2 in a writing operation.

In addition, in the unit magnetic memory 11 and the magnetic memory M according to this embodiment, information stored in the first magnetoresistance effect elements MTJ1 or information stored in the second magnetoresistance effect element MTJ2 can be separately read in a reading operation.

In this way, in the unit magnetic memory 11 and the magnetic memory M according to this embodiment, a high recording density can be realized.

<Configuration Example>

As one configuration example, a magnetic memory M includes a first bit line BL1, a second bit line BL2, and a third bit line BL3, word lines WL1 to WL3, first magnetoresistance effect elements MTJ1, MTJ3, and MTJ5, first transistors Tr1, Tr3, and Tr5, second magnetoresistance effect elements MTJ2, MTJ4, and MTJ6, and second transistors Tr2, Tr4, and Tr6.

There are series circuits of the first magnetoresistance effect elements MTJ1, MTJ3, and MTJ5 and the first transistors Tr1, Tr3, and Tr5 between the first bit line BL1 and the second bit line BL2. The free layers 51 of the first magnetoresistance effect elements MTJ1, MTJ3, and MTJ5 and the second bit line BL2 are connected. The fixed layers 53 of the first magnetoresistance effect elements MTJ1, MTJ3, and MTJ5 and the source terminals of the first transistors Tr1, Tr3, and Tr5 are respectively connected. The drain terminals of the first transistors Tr1, Tr3, and Tr5 and the first bit line BL1 are connected.

Series circuits of the second magnetoresistance effect elements MTJ2, MTJ4, and MTJ6 and the second transistors Tr2, Tr4, and Tr6 are present between the second bit line BL1 and the third bit line BL3. The free layers 71 of the second magnetoresistance effect elements MTJ2, MTJ4, and MTJ6 and the second bit line BL2 are connected. The fixed layers 73 of the second magnetoresistance effect elements MTJ2, MTJ4, and MTJ6 and the drain terminals of the second transistors Tr2, Tr4, and Tr6 are respectively connected. The source terminals of the second transistors Tr2, Tr4, and Tr6 and the third bit line BL3 are connected.

The word lines WL1 to WL3, the gate terminals of the first transistors Tr1, Tr3, and Tr5, and the gate terminals of the second transistors Tr2, Tr4, and Tr6 are respectively connected.

As one configuration example, in the magnetic memory M, a voltage difference is applied between both ends of the second bit line BL2, whereby a spin orbit torque (SOT) is induced.

As one configuration example, in the magnetic memory M, the free layers 51 of the first magnetoresistance effect elements MTJ1, MTJ3, and MTJ5 and the free layers 71 of the second magnetoresistance effect elements MTJ2, MTJ4, and MTJ6 are respectively conductively connected (connected in a conductive state) to a first face (for example, an upper face or the like) and a second face (for example, a lower face or the like) of the second bit line BL2 facing each other.

As one configuration example, in the magnetic memory M, at a first connection point at which the free layers 51 of the first magnetoresistance effect elements MTJ1, MTJ3, and MTJ5 are conductively connected to the first face of the second bit line BL2 and a second connection point at which the free layers 71 of the second magnetoresistance effect elements MTJ2, MTJ4, and MTJ6 are connected to the second face of the second bit line BL2, a face (for example, a junction face) on which the free layers 51 of the first magnetoresistance effect elements MTJ1, MTJ3, and MTJ5 are brought into contact with the first face of the second bit line BL2 and a face (for example, a junction face) on which the free layers 71 of the second magnetoresistance effect elements MTJ2, MTJ4, and MTJ6 are brought into contact with the second face of the second bit line BL2 overlap with each other at least in a part when seen in a direction perpendicular to the first face and the second face.

As one configuration example, the magnetic memory M includes a first switching circuit SW1, a second switching circuit SW2, a third switching circuit SW3, and a fourth switching circuit SW4, a first voltage generating circuit 151, a second voltage generating circuit 152, a third voltage generating circuit 153, and a fourth voltage generating circuit 154, and a row decoder 131.

One end of the first switching circuit SW1 is connected to one end of the first bit line BL1, and the other end of the first switching circuit SW1 is connected to the first voltage generating circuit 151.

One end of the second switching circuit SW2 is connected to one end of the second bit line BL2, and the other end of the second switching circuit SW2 is connected to the second voltage generating circuit 152.

One end of the third switching circuit SW3 is connected to the other end of the second bit line BL2, and the other end of the third switching circuit SW3 is connected to the third voltage generating circuit 153.

One end of the fourth switching circuit SW4 is connected to one end of the third bit line BL3, and the other end of the fourth switching circuit SW4 is connected to the fourth voltage generating circuit 154.

The row decoder 131 is connected to one ends of the word lines WL1 to WL3.

As one configuration example, in a complementary magnetic memory M1, by applying an electric potential difference between the second voltage generating circuit 152 and the third voltage generating circuit 153, an SOT current flows through the second bit line BL2. In addition, by applying an electric potential difference between the first voltage generating circuit 151 and the fourth voltage generating circuit 154 at a timing after the start of flowing of the SOT current and applying a predetermined voltage to the word line (for example, one of the word lines WL1 to WL3), STT currents flow through both the first magnetoresistance effect elements MTJ1, MTJ3, and MTJ5 and the second magnetoresistance effect elements MTJ2, MTJ4, and MTJ6, and the identical data is respectively written in the first magnetoresistance effect elements MTJ1, MTJ3, and MTJ5 and the second magnetoresistance effect elements MTJ2, MTJ4, and MTJ6.

As one configuration example, in a both-side independent-type magnetic memory M2, by applying an electric potential difference between the second voltage generating circuit 152 and the third voltage generating circuit 153, an SOT current flows through the second bit line BL2. In addition, by applying an electric potential difference between the first voltage generating circuit 151 and the fourth voltage generating circuit 154 at a timing after the start of flowing of the SOT current and applying a predetermined voltage to the word line (for example, one of the word lines WL1 to WL3), an STT current flows through one side of the first magnetoresistance effect elements MTJ1, MTJ3, and MTJ5 and the second magnetoresistance effect elements MTJ2, MTJ4, and MTJ6, and data is written in the one side of the first magnetoresistance effect elements MTJ1, MTJ3, and MTJ5 and the second magnetoresistance effect elements MTJ2, MTJ4, and MTJ6.

By recording a program for realizing the functions of each device (for example, a device configuring the control unit or the like) according to the embodiment illustrated above on a computer-readable recording medium (storage medium) and permitting a computer system to read and execute the program recorded on this recording medium, the process may be performed.

The "computer system" described here may include an operating system (OS) or hardware such as peripheral devices.

In addition, the "computer-readable recording medium" represents a writable nonvolatile memory such as a flexible disk, a magneto-optical disk, a read only memory (ROM), or a flash memory, a portable medium such as a digital versatile disc (DVD), or a storage device such as a hard disk built in a computer system.

Furthermore, the "computer-readable recording medium" includes a medium storing a program for a fixed time such as a volatile memory (for example, a dynamic random access memory (DRAM)) disposed inside a computer system that becomes a server or a client in a case in which a program is transmitted through a network such as the internet or a communication line such as a telephone line. The program described above may be transmitted from a computer system storing this program in a storage device or the like to another computer system through a transmission medium or a transmission wave in a transmission medium. Here, the "transmission medium" transmitting a program represents a medium having an information transmitting function such as a network including the Internet and the like or a communication line including a telephone line. The program described above may be used for realizing a part of the functions described above. In addition, the program described above may be a program realizing the functions described above by being combined with a program recorded in the computer system in advance, a so-called a differential file (differential program).

While preferred embodiments of the disclosure have been described and illustrated above, it should be understood that these are exemplary of the disclosure and are not to be considered as limiting. Additions, omissions, substitutions, and other modifications can be made without departing from the spirit or scope of the present disclosure. Accordingly, the disclosure is not to be considered as being limited by the foregoing description, and is only limited by the scope of the appended claims

EXPLANATION OF REFERENCES 11 to 13: Unit magnetic memory
31, 111, 411, 3011, 5011, 6011, A1 to A((n+1)/2): Spin-orbit torque wiring
51, 71, 5051, 5071, 6051, 6071: Free layer
52, 72, 5052, 5072, 6052, 6072: Nonmagnetic layer
53, 73, 5053, 5073, 6053, 6073: Fixed layer
131: Row decoder
151 to 154: Voltage generating circuit
211, 511 to 512: Differential reading circuit
341 to 344, 641 to 644, 672, 741 to 744, 772: NMOS
346 to 349, 357, 359, 646 to 649, 657, 659, 746 to 749, 757, 759: Wiring
351 to 354, 651 to 654, 751 to 754: PMOS
356, 358, 656, 658, 756, 758 connection point
360, 660, 760: Amplifier
361, 661, 761: Output terminal
671, 771: OR circuit
670, 770: Reference unit
673, 773: Resistance part
1011 to 1014, 1021 to 1022, 1031 to 1032, 1041 to 1042, 1051 to 1052, 1061, 1071, 1211 to 1214, 1221 to 1222, 1231 to 1232, 1241 to 1242, 1251 to 1252, 1261, 1271, 4011 to 4014, C1 to C5: Voltage
2011, 2111: SOT current
2021, 2121: STT current
5031 to 5032, 6031 to 6032, MTJ, MTJ1 to MTJ(n+1): Magnetoresistance effect element
M, M1 to M2: Magnetic memory
Tr1 to Tr(n+1): Transistor
BL1 to BL3: Bit line
WL1 to WL3: Word line
SW1 to SW4: Switching circuit

What is claimed is:

1. A magnetic memory comprising:
   a first bit line, a second bit line, and a third bit line;
   a word line;
   a first magnetoresistance effect element;
   a first transistor;
   a second magnetoresistance effect element; and
   a second transistor, wherein
   a series circuit of the first magnetoresistance effect element and the first transistor is present between the first bit line and the second bit line,
   a free layer of the first magnetoresistance effect element and the second bit line are connected to each other,
   a fixed layer of the first magnetoresistance effect element and a source terminal of the first transistor are connected to each other,
   a drain terminal of the first transistor and the first bit line are connected to each other,
   a series circuit of the second magnetoresistance effect element and the second transistor is present between the second bit line and the third bit line,
   a free layer of the second magnetoresistance effect element and the second bit line are connected to each other,
   a fixed layer of the second magnetoresistance effect element and a drain terminal of the second transistor are connected to each other,
   a source terminal of the second transistor and the third bit line are connected to each other, and
   the word line is connected to each of a gate terminal of the first transistor and a gate terminal of the second transistor.

2. The magnetic memory according to claim 1, wherein the magnetic memory is configured for a spin orbit torque to be induced by applying a voltage difference between both ends of the second bit line.

3. The magnetic memory according to claim 2, further comprising:
   a first switching circuit, a second switching circuit, a third switching circuit, and a fourth switching circuit;

a first voltage generating circuit, a second voltage generating circuit, a third voltage generating circuit, and a fourth voltage generating circuit; and a row decoder, wherein one end of the first switching circuit is connected to one end of the first bit line, and the other end of the first switching circuit is connected to the first voltage generating circuit, one end of the second switching circuit is connected to one end of the second bit line, and the other end of the second switching circuit is connected to the second voltage generating circuit, one end of the third switching circuit is connected to the other end of the second bit line, and the other end of the third switching circuit is connected to the third voltage generating circuit, one end of the fourth switching circuit is connected to one end of the third bit line, and the other end of the fourth switching circuit is connected to the fourth voltage generating circuit, and the row decoder is connected to one end of the word line.

4. The magnetic memory according to claim 2, wherein each of the free layer of the first magnetoresistance effect element and the free layer of the second magnetoresistance effect element is conductively connected to a first face and a second face of the second bit line facing each other, respectively.

5. The magnetic memory according to claim 4, wherein at least a part of a face, on which the free layer of the first magnetoresistance effect element contacts the first face of the second bit line, and a face, on which the free layer of the second magnetoresistance effect element contacts the second face of the second bit line, overlaps at a first connection point at which the free layer of the first magnetoresistance effect element is conductively connected to the first face of the second bit line and a second connection point at which the free layer of the second magnetoresistance effect element is conductively connected to the second face of the second bit line, as viewed in a direction perpendicular to the first face and the second face.

6. The magnetic memory according to claim 5, further comprising:

a first switching circuit, a second switching circuit, a third switching circuit, and a fourth switching circuit;

a first voltage generating circuit, a second voltage generating circuit, a third voltage generating circuit, and a fourth voltage generating circuit; and a row decoder, wherein one end of the first switching circuit is connected to one end of the first bit line, and the other end of the first switching circuit is connected to the first voltage generating circuit, one end of the second switching circuit is connected to one end of the second bit line, and the other end of the second switching circuit is connected to the second voltage generating circuit, one end of the third switching circuit is connected to the other end of the second bit line, and the other end of the third switching circuit is connected to the third voltage generating circuit, one end of the fourth switching circuit is connected to one end of the third bit line, and the other end of the fourth switching circuit is connected to the fourth voltage generating circuit, and the row decoder is connected to one end of the word line.

7. The magnetic memory according to claim 4, further comprising:

a first switching circuit, a second switching circuit, a third switching circuit, and a fourth switching circuit;

a first voltage generating circuit, a second voltage generating circuit, a third voltage generating circuit, and a fourth voltage generating circuit; and a row decoder, wherein one end of the first switching circuit is connected to one end of the first bit line, and the other end of the first switching circuit is connected to the first voltage generating circuit, one end of the second switching circuit is connected to one end of the second bit line, and the other end of the second switching circuit is connected to the second voltage generating circuit, one end of the third switching circuit is connected to the other end of the second bit line, and the other end of the third switching circuit is connected to the third voltage generating circuit, one end of the fourth switching circuit is connected to one end of the third bit line, and the other end of the fourth switching circuit is connected to the fourth voltage generating circuit, and the row decoder is connected to one end of the word line.

8. The magnetic memory according to claim 1, wherein each of the free layer of the first magnetoresistance effect element and the free layer of the second magnetoresistance effect element is conductively connected to a first face and a second face of the second bit line facing each other, respectively.

9. The magnetic memory according to claim 8, wherein at least a part of a face, on which the free layer of the first magnetoresistance effect element contacts the first face of the second bit line, and a face, on which the free layer of the second magnetoresistance effect element contacts the second face of the second bit line, overlaps at a first connection point at which the free layer of the first magnetoresistance effect element is conductively connected to the first face of the second bit line and a second connection point at which the free layer of the second magnetoresistance effect element is conductively connected to the second face of the second bit line, as viewed in a direction perpendicular to the first face and the second face.

10. The magnetic memory according to claim 9, further comprising:

a first switching circuit, a second switching circuit, a third switching circuit, and a fourth switching circuit;

a first voltage generating circuit, a second voltage generating circuit, a third voltage generating circuit, and a fourth voltage generating circuit; and a row decoder, wherein one end of the first switching circuit is connected to one end of the first bit line, and the other end of the first switching circuit is connected to the first voltage generating circuit, one end of the second switching circuit is connected to one end of the second bit line, and the other end of the second switching circuit is connected to the second voltage generating circuit, one end of the third switching circuit is connected to the other end of the second bit line, and the other end of the third switching circuit is connected to the third voltage generating circuit, one end of the fourth switching circuit is connected to one end of the third bit line, and the other end of the fourth switching circuit is connected to the fourth voltage generating circuit, and the row decoder is connected to one end of the word line.

11. The magnetic memory according to claim 8, further comprising:
   a first switching circuit, a second switching circuit, a third switching circuit, and a fourth switching circuit;
   a first voltage generating circuit, a second voltage generating circuit, a third voltage generating circuit, and a fourth voltage generating circuit; and
   a row decoder, wherein
   one end of the first switching circuit is connected to one end of the first bit line, and the other end of the first switching circuit is connected to the first voltage generating circuit,
   one end of the second switching circuit is connected to one end of the second bit line, and the other end of the second switching circuit is connected to the second voltage generating circuit,
   one end of the third switching circuit is connected to the other end of the second bit line, and the other end of the third switching circuit is connected to the third voltage generating circuit,
   one end of the fourth switching circuit is connected to one end of the third bit line, and the other end of the fourth switching circuit is connected to the fourth voltage generating circuit, and
   the row decoder is connected to one end of the word line.

12. The magnetic memory according to claim 1, further comprising:
   a first switching circuit, a second switching circuit, a third switching circuit, and a fourth switching circuit;
   a first voltage generating circuit, a second voltage generating circuit, a third voltage generating circuit, and a fourth voltage generating circuit; and
   a row decoder, wherein
   one end of the first switching circuit is connected to one end of the first bit line, and the other end of the first switching circuit is connected to the first voltage generating circuit,
   one end of the second switching circuit is connected to one end of the second bit line, and the other end of the second switching circuit is connected to the second voltage generating circuit,
   one end of the third switching circuit is connected to the other end of the second bit line, and the other end of the third switching circuit is connected to the third voltage generating circuit,
   one end of the fourth switching circuit is connected to one end of the third bit line, and the other end of the fourth switching circuit is connected to the fourth voltage generating circuit, and
   the row decoder is connected to one end of the word line.

13. The magnetic memory according to claim 12, wherein the magnetic memory is configured in such way that an identical data are written on the first magnetoresistance effect element and the second magnetoresistance effect element by: an SOT current flowing to the second bit line due to application of an electric potential difference between the second voltage generating circuit and the third voltage generating circuit; and an STT current flowing to both of the first magnetoresistance effect element and the second magnetoresistance effect element due to application of an electric potential difference between the first voltage generating circuit and the fourth voltage generating circuit at a timing after start of flowing of the SOT current for a predetermined voltage to be applied to the word line.

14. The magnetic memory according to claim 12, wherein the magnetic memory is configured in such way that data are written on one of the first magnetoresistance effect element and the second magnetoresistance effect element by: an SOT current flowing to the second bit line due to application of an electric potential difference between the second voltage generating circuit and the third voltage generating circuit; and an STT current flowing to the one of the first magnetoresistance effect element and the second magnetoresistance effect element due to application of an electric potential difference between the first voltage generating circuit and the fourth voltage generating circuit at a timing after start of flowing of the SOT current for a predetermined voltage to be applied to the word line.

* * * * *